US009485861B2

(12) United States Patent
Endo et al.

(10) Patent No.: US 9,485,861 B2
(45) Date of Patent: Nov. 1, 2016

(54) PREPREG COMPRISING POLYPHENYLENE ETHER PARTICLES

(71) Applicant: ASAHI KASEI E-MATERIALS CORPORATION, Chiyoda-ku, Tokyo (JP)

(72) Inventors: Masaaki Endo, Tokyo (JP); Takamitsu Utsumi, Tokyo (JP); Shoji Otani, Tokyo (JP)

(73) Assignee: ASAHI KASEI E-MATERIALS CORPORATION, Tokyo (JP)

( * ) Notice: Subject to any disclaimer, the term of this patent is extended or adjusted under 35 U.S.C. 154(b) by 0 days.

(21) Appl. No.: 14/472,221

(22) Filed: Aug. 28, 2014

(65) Prior Publication Data
US 2015/0057413 A1  Feb. 26, 2015

Related U.S. Application Data

(62) Division of application No. 14/128,555, filed as application No. PCT/JP2013/057882 on Mar. 19, 2013.

(30) Foreign Application Priority Data

Mar. 19, 2012 (JP) ................. 2012-062455
Mar. 19, 2012 (JP) ................. 2012-062754

(51) Int. Cl.
*H05K 1/03* (2006.01)
*C08J 5/24* (2006.01)
*B32B 15/08* (2006.01)
*B32B 7/06* (2006.01)
*B32B 15/20* (2006.01)
*B32B 27/20* (2006.01)
*B32B 27/32* (2006.01)
*B32B 27/28* (2006.01)

(52) U.S. Cl.
CPC ............. *H05K 1/0366* (2013.01); *B32B 7/06* (2013.01); *B32B 15/08* (2013.01); *B32B 15/20* (2013.01); *B32B 27/20* (2013.01); *B32B 27/285* (2013.01); *B32B 27/32* (2013.01); *C08J 5/24* (2013.01); *H05K 1/0373* (2013.01); *B32B 2264/0257* (2013.01); *B32B 2307/306* (2013.01); *B32B 2307/538* (2013.01); *B32B 2457/08* (2013.01); *C08J 2371/12* (2013.01); *H05K 2201/0137* (2013.01); *H05K 2201/0212* (2013.01); *Y10T 428/24355* (2015.01)

(58) Field of Classification Search
CPC ............. H05K 1/0366; H05K 1/0373; H05K 2201/0137; H05K 2201/0212; B32B 15/08; C08J 5/24; C08J 2371/12; Y10T 428/24355
USPC ......................................... 428/141
See application file for complete search history.

(56) References Cited

U.S. PATENT DOCUMENTS

| 2004/0265595 | A1 | 12/2004 | Tokiwa | |
|---|---|---|---|---|
| 2008/0254257 | A1 | 10/2008 | Inoue et al. | |
| 2009/0018303 | A1* | 1/2009 | Onizuka | C08G 59/621 528/88 |
| 2009/0203279 | A1* | 8/2009 | Mori | C08G 65/44 442/233 |
| 2009/0247032 | A1* | 10/2009 | Mori | C08G 65/485 442/181 |

FOREIGN PATENT DOCUMENTS

| JP | 9-104094 A | 4/1997 |
|---|---|---|
| JP | 2001-19839 A | 1/2001 |
| JP | 2003-188543 A | 7/2003 |
| JP | 2006-8750 A | 1/2006 |
| JP | 2008-50526 A | 3/2008 |
| JP | 2011-1473 A | 1/2011 |
| TW | I227249 | 9/1991 |
| TW | 200420663 | 1/1993 |

OTHER PUBLICATIONS

International Search Report for PCT/JP2013/057882 mailed May 14, 2013.
Taiwanese Office Action dated Jul. 14, 2014 for Application No. 102109726.

* cited by examiner

*Primary Examiner* — Nathan Van Sell
(74) *Attorney, Agent, or Firm* — Birch, Stewart, Kolasch & Birch, LLP

(57) ABSTRACT

Provided is a prepreg suffering little resin particle fall-off and little resin peeling during prepreg production and during handling in order to have excellent dielectric properties for PPE and favorable adhesiveness. A PPE-containing prepreg constituted of a base material and a curable resin composition including PPE particles, wherein the prepreg is characterized in that (1) PPE extracted from the prepreg using a mixed solvent of toluene and methanol in a mass ratio of 95:5 includes PPE particles (A) insoluble in the mixed solvent, (2) the amount of PPE contained in the PPE particles (A) is 70 mass % or higher, and (3) the number-average molecular weight of the PPE contained in the PPE particles (A) is 8,000-40,000.

7 Claims, 2 Drawing Sheets

Prepreg of Example 2
Observation during prepreg powder fall-off, peeling test

Prepreg of Comparative Example 1
Observation during prepreg powder fall-off, peeling test

PREPREG COMPRISING POLYPHENYLENE ETHER PARTICLES

CROSS REFERENCE TO RELATED APPLICATIONS

This application is a Divisional of copending application Ser. No. 14/128,555, filed on Dec. 20, 2013, which was filed as PCT International Application No. PCT/JP2013/057882 on Mar. 19, 2013, which claims the benefit under 35 U.S.C. §119(a) to Patent Application No. 2012-062455, filed in Japan on Mar. 19, 2012, and Patent Application No. 2012-062754, filed in Japan on Mar. 19, 2012, all of which are hereby expressly incorporated by reference into the present application.

TECHNICAL FIELD

The present invention relates to a prepreg comprising polyphenylene ether particles.

BACKGROUND ART

In recent years, with the significant progress in information network technology and expanding services that implement information networks, there has been a demand for increased data volumes and faster processing speeds for electronic devices. Smaller signal wavelengths are effective for transferring digital signals in greater volumes and at higher speeds, and advances are being made toward achieving higher signal frequencies. Because electrical signals in the high-frequency range tend to decay in wiring circuits, there is a need for electronic circuit boards with high transmission characteristics.

Two approaches are effective for obtaining electronic circuit boards with high transmission characteristics, namely (i) reducing the dielectric loss tangent of the dielectric material (such as the insulating resin reinforced in the base material) and (ii) lowering the skin resistance of the conductor (such as metal wiring).

As a method of (i) reducing the dielectric loss tangent of the dielectric material, there is known a method using a low-dielectric resin such as polyphenylene ether (hereunder, PPE) as the insulating resin. PPE has low permittivity, a low dielectric loss tangent and an excellent high-frequency characteristic (i.e. dielectric characteristic), as well as high heat resistance, and is therefore suitable as an insulating material for electronic circuit boards of electronic devices that utilize high frequency bands.

In PTL 1 there is disclosed a technique of adding a curable monomer or polymer to PPE to form a curable resin composition. In PTL 2, there is disclosed a method of chemically modifying PPE and combining the PPE with triallyl isocyanurate and/or triallyl cyanurate as a curable monomer to form a curable resin composition. PTLs 3 and 4 disclose PPE resin compositions employing low-molecular-weight PPE. Also, PTLs 5 and 6 describe methods using opaque dispersions in which particles of a resin composition comprising a crosslinkable resin such as PPE or styrene-butadiene copolymer and a crosslinking aid such as triallyl isocyanurate (TRIC) are dispersed in a non-chlorine-based organic solvent at ordinary temperature. PTL 7 describes a resin composition comprising low molecular weight PPE and an epoxy resin. PTL 8 describes a method employing a varnish in which PPE particles are dispersed in a solvent consisting of at least 90% water.

PTL 9 describes a low-dielectric resin comprising a PPE-modified butadiene polymer, an inorganic filler and a saturated thermoplastic elastomer. PTL 10 describes a high-frequency multilayer wiring board employing PPE as a low-dielectric resin. PTL 11 describes a laminating material employing a thermosetting resin comprising a resin with a polyphenylene oxide backbone and TAIL, as a low-dielectric resin.

CITATION LIST

Patent Literature

PTL 1: Japanese Unexamined Patent Publication SHO No. 61-287739

PTL 2: Japanese Unexamined Patent Publication HEI No. 4-239017

PTL 3: Japanese Unexamined Patent Publication No. 2002-26577

PTL 4: Japanese Unexamined Patent Publication No. 2008-260942 PTL 5: Japanese Unexamined Patent Publication HEI No. 7-292126

PTL 6: Japanese Unexamined Patent Publication No. 2008-50528

PTL 7: Japanese Unexamined Patent Publication No. 2006-63114

PTL 8: Japanese Unexamined Patent Publication No. 2003-34731

PTL 9: International Patent Publication No. WO2008/136373

PTL 10: Japanese Unexamined Patent Publication No. 2004-140268

PTL 11: Japanese Unexamined Patent Publication No. 2003-283098

DISCLOSURE OF THE INVENTION

Problems to be Solved by the Invention

However, the technologies described in PTLs 1 to 8 still have much room for improvement from the viewpoint of obtaining prepregs exhibiting the excellent dielectric characteristics of PPE while having low resin dust fall-off or resin flaking during production and handling, and also with excellent adhesion of cured products (interlayer peel strength of multilayer boards, or peel strength between cured curable resin compositions and metal foils such as copper foils).

On the other hand, while the technologies described in PTLs 9 to 11 are designed to improve adhesion between low-dielectric resins and metal foils, they cannot adequately be applied for reducing roughness and thicknesses of metal foils, and therefore they have also had room for improvement. Furthermore, the technologies described in PTLs 9 to 11 were not developed from the viewpoint of improving resin cracking occurring near the base material or metal foil under thermal load, moisture absorption load and mechanical load.

In light of this situation, it is an object of the present invention to provide a prepreg exhibiting the excellent dielectric characteristics of PPE while also having satisfactory adhesion, and therefore having low resin dust fall-off or resin flaking during production and handling of prepregs.

It is another object to provide a laminated sheet that can minimize cracking due to stress acting as a result of thermal load, moisture absorption load and mechanical load during production and handling.

Means for Solving the Problems

As a result of much diligent research conducted with the aim of solving the problems described above, the present inventors have completed this invention based on the knowledge of the finding that when a prescribed amount of PPE particles is added to a prepreg and the content ratio, particle size and PPE content of the PPE particles are controlled to prescribed ranges, this improves the adhesion exhibited between a base material, and the PPE-containing curable resin of the prepreg or a board produced by hot pressure molding from the prepreg.

The present inventors further found that in a layered material composed of a low-dielectric resin, a base material and a low-roughness metal foil, increasing the metal foil peel strength to above a certain value and maintaining a suitable range for the coefficient of linear thermal expansion of the laminated sheet, as well as controlling the ratio between the metal foil peel strength and the peel strength between the low-dielectric resin and the base material to within a prescribed range, inhibits cracking between each of the layers or near the layers, allowing application of low-roughness copper foils, and the invention has been completed upon this finding.

Specifically, the present invention is as follows.

[1] A PPE-containing prepreg comprising a base material and a curable resin composition containing polyphenylene ether (PPE) particles, wherein:

(1) PPE extracted from the prepreg using a toluene/methanol mixed solvent with a mass ratio of 95:5 includes insoluble PPE particles (A) in the mixed solvent, (2) the content of PPE in the PPE particles (A) is 70 mass % or greater, and (3) the number-average molecular weight of the PPE in the PPE particles (A) is between 8,000 and 40,000.

[2] A PPE-containing prepreg according to [1] above, wherein at least 60% of all of the PPE particles (A) have sizes of between 0.3 μm and 200 μm, and at least 60% of all of the PPE particles (A) have sizes of between 1.0 μm and 100 μm.

[3] A PPE-containing prepreg according to [1] or [2] above, wherein at least 60% of all of the primary particles (A') composing the PPE particles (A) have sizes of between 0.3 μm and 30 μm, and at least 60% of all of the particles have particle sizes of between 0.3 μm and 20 μm.

[4] A PPE-containing prepreg according to [3] above, wherein the maximum particle size of the primary particles (A') composing the PPE particles (A) is no greater than 40 μm.

[5] A PPE-containing prepreg according to any one of [1] to [4] above, wherein also:

(4) PPE extracted from the prepreg using a toluene/methanol mixed solvent with a mass ratio of 95:5 includes dissolved PPE (B) which is dissolved in the mixed solvent, in addition to the insoluble PPE particles (A) in the mixed solvent, and (5) the mass ratio of the PPE particles (A) and the dissolved PPE (B) is 99:1 to 45:55.

[6] A PPE-containing prepreg according to [5] above, wherein the number-average molecular weight of the dissolved PPE (B) is between 5,000 and 40,000.

[7] A PPE-containing prepreg according to [5] above, wherein the number-average molecular weight of the dissolved PPE (B) is between 1,000 and 7,000, and the average number of phenolic hydroxyl groups per molecule is less than 0.5.

[8] A PPE-containing prepreg according to any one of [1] to [7] above, wherein the content of PPE in the curable resin composition is between 10 mass % and 70 mass % based on 100 mass % as the curable resin composition.

[9] A PPE-containing prepreg according to any one of [1] to [8] above, further comprising a crosslinking curable component (C) and an initiator (D).

[10] A PPE-containing prepreg according to [9] above, wherein the crosslinking curable component (C) is a monomer with two or more vinyl groups in the molecule.

[11] A PPE-containing prepreg according to [10] above, wherein the crosslinking curable component (C) is triallyl isocyanurate (TRIC).

[12] A PPE-containing prepreg according to any one of [1] to [11], further comprising an epoxy resin at a content of between 0.1 mass % and 10 mass %. [13] An electronic circuit board formed using a PPE-containing prepreg according to any one of [1] to [12], or its material.

[14] A laminated sheet comprising a low-dielectric resin and a base material, wherein:

(1) the dielectric loss tangent of the laminated sheet at 10 GHz is no greater than 0.007 (cavity resonance method), (2) the metal foil peel strength of the laminated sheet with a metal foil that has a side with a surface smoothness of no greater than Rz 2.0 μm is 0.6 N/mm or greater, (3) the coefficient of linear thermal expansion of the laminated sheet (≤Tg) is between 20 ppm/K and 60 ppm/K, and (4) the peel strength between the low-dielectric resin and the base material is between 0.8 and 1.8 times the metal foil peel strength.

[15] A laminated sheet according to [14] above, wherein the Tg of the laminated sheet is 180° C. or higher.

[16] A laminated sheet according to [14] or [15] above, wherein the thickness of the metal foil is less than 35 μm.

[17] A laminated sheet according to any one of [14] to [16] above, wherein the metal foil peel strength of the laminated sheet with a metal foil that has a side with a surface smoothness of no greater than Rz 2.0 μm is 0.8 N/mm or greater.

[18] A laminated sheet according to any one of [14] to [17] above, wherein the peel strength of the laminated sheet with the low-dielectric resin and the base material is 0.6 N/mm or greater.

[19] A laminated sheet according to any one of [14] to [18] above, wherein the ratio between the peel strength of the laminated sheet with the low-dielectric resin and the base material, and the metal foil peel strength (base material-resin/metal foil ratio) is between 1.05 and 1.8.

[20] A laminated sheet according to [19] above, wherein the ratio between the peel strength of the laminated sheet with the low-dielectric resin and the base material, and the metal foil peel strength (base material-resin/metal foil ratio) is between 1.3 and 1.8.

[21] A laminated sheet according to any one of [14] to [20] above, wherein the low-dielectric resin comprises polyphenylene ether (PPE) at between 10 mass % and 70 mass % based on 100 mass % as the low-dielectric resin.

[22] A laminated sheet according to any one of [14] to [21] above, formed using a PPE-containing prepreg according to any one of [1] to [12].

[23] A laminated sheet according to [21] or [22] above, wherein the PPE has a number-average molecular weight of between 1,000 and 7,000, and the average number of phenolic hydroxyl groups per PPE molecule is between 0.1 and 0.6.

Effect of the Invention

According to the invention there is provided a prepreg exhibiting the excellent dielectric characteristics of PPE while also having satisfactory adhesion, and therefore having low resin dust fall-off or resin flaking during production and handling of prepregs. There is further provided a laminated sheet that can minimize cracking due to stress acting as a result of thermal load, moisture absorption load and mechanical load during production and handling.

BEST MODE FOR CARRYING OUT THE INVENTION

Embodiments of the present invention will now be described in detail, with the understanding that the invention is not to be limited thereto. The first embodiment is a prepreg constructed from a base material and a curable resin composition containing PPE particles.
<Polyphenylene Ether (PPE)>
According to the first embodiment, the PPE preferably includes a repeating structural unit represented by the following formula (1):

[Chemical Formula 1]

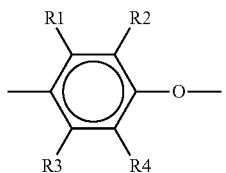

(1)

[wherein R1, R2, R3 and R4 each independently represent hydrogen, a halogen atom, or optionally substituted alkyl, optionally substituted alkoxy, optionally substituted aryl, optionally substituted amino group, nitro group or carboxyl].

Specific examples for PPE include poly(2,6-dimethyl-1,4-phenylene ether), poly(2-methyl-6-ethyl-1,4-phenylene ether), poly(2-methyl-6-phenyl-1,4-phenylene ether), poly(2,6-dichloro-1,4-phenylene ether) and the like, as well as copolymers of 2,6-dimethylphenol with other phenols (for example, 2,3,6-trimethylphenol or 2-methyl-6-butylphenol), and polyphenylene ether copolymers obtained by coupling of 2,6-dimethylphenol with biphenols or bisphenols, among which a preferred example is poly(2,6-dimethyl-1,4-phenylene ether).

Throughout the present specification, "PPE" refers to a polymer comprising a substituted or unsubstituted phenylene ether unit structure, and it may include another copolymerizing component.

The prepreg of the first embodiment contains insoluble PPE particles (A) in a toluene/methanol mixed solvent with a mass ratio of 95:5, as PPE extracted from the mixed solvent.

Figure 2:
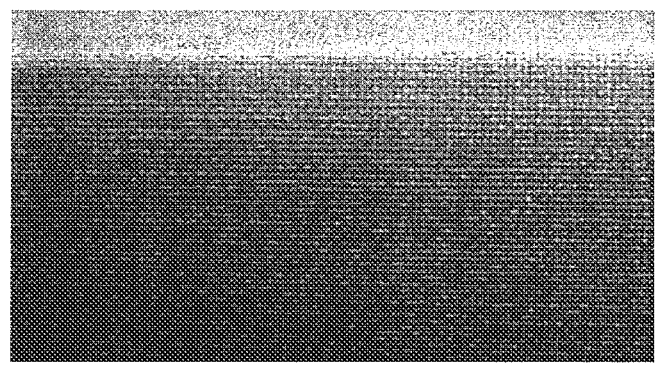
FIG. 2 is a photographic image of a prepreg with PPE particles (Example 2) and a prepreg without PPE particles (Comparative Example 1), after a powder fall-off and peeling test.
Figure 2:
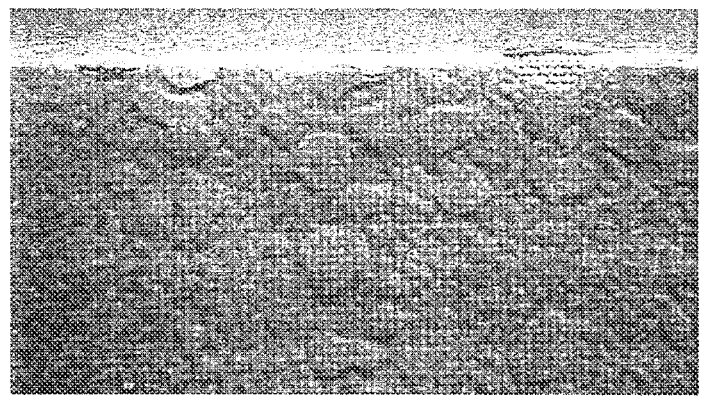

If such PPE particles (A) are present in the prepreg, it is possible to inhibit film formation by the resin layer during the step of drying the solvent after the resin varnish has been coated during production of the prepreg. This is preferred to help prevent formation of a film-like substance on the surface layer of the complex of the curable resin composition and the base material, and peeling off of the film-like substance during the subsequent prepreg production process and handling. It is also preferred because, for the same reason, it can inhibit formation of a film-like substance on the surface layer of the complex of the curable resin composition and the base material during the step of coating the resin varnish during production of the prepreg, thus eliminating escape channels for the gasified solvent from the interior of the complex and consequently minimizing the phenomenon of residual voids between the base material and the resin layer. For reference, FIG. 2 shows a photographic image of a prepreg with PPE particles (Example 2) and a prepreg without PPE particles (Comparative Example 1), after a powder fall-off and peeling test. Also, inhibiting film formation of the resin layer reduces the solvent drying load during the drying step, and is therefore preferred from the viewpoint of minimizing ongoing deterioration caused by residual solvent and inhibition of curing of the curable resin composition.

Furthermore, the presence of such PPE particles (A) in the prepreg can improve adhesion between the base material and the cured resin and adhesion between the cured resin and the metal foil. This is preferred because it will increase the interlayer peel strength and copper foil peel strength of the cured complex, and will also tend to provide the cured complex with increased moisture absorption resistance, heat resistance, and stability of electrical characteristics under hygroscopic conditions.

While the reason is not fully understood, it is believed that under ordinary hot pressure molding conditions, this allows the melting rate of the PPE particles (A) to be appropriately delayed with respect to that of the thermosetting resin components other than the PPE particles (A). As a result, the thermosetting resin components other than the PPE particles (A) fuse first and cover the surface of the base material and strongly adhere to the base material. In addition, it is conjectured that since the molten PPE component becomes covered with a delay after the PPE particles (A) and the thermosetting resin cures during the process of compatibilization between the thermosetting resin components and the PPE component, adhesion between the base material and the cured curable resin composition is satisfactory. A preferred form for the PPE particles (A) for achieving satisfactory adhesion between the base material and the cured curable resin composition will be described below.

The PPE particles (A) contain PPE at 70 mass % or greater, preferably 80 mass % or greater, more preferably 85 mass % or greater and even more preferably 90 mass % or greater.

If the PPE component in the PPE particles (A) is present within this range, adhesion between the base material and the cured thermosetting resin composition in the cured complex described below will be satisfactory, and this will tend to yield a cured complex having moisture absorption resistance, heat resistance and excellent electrical characteristics under hygroscopic conditions.

The reason for this is not entirely clear, but the following explanations are possible.

(i) The high PPE content of the PPE particles (A) results in a low PPE component content in the components other than the PPE particles, thereby increasing the content of the thermosetting resin components other than the PPE component.

(ii) The PPE particles (A) have a slower melting rate than the thermosetting resin components other than the PPE particles (A).

(iii) During the hot pressure molding process, first the thermosetting resin components other than the PPE particles (A), which have a rapid melting rate, undergo melting and cover the surface of the base material. During this time, adhesion with the base material is stronger because of the large content ratio of the thermosetting resin components other than the PPE component.

(iv) Next, presumably the molten PPE component becomes covered with a delay after the PPE particles (A) and the thermosetting resin cures during the process of compatibilization between the thermosetting resin components and the PPE component, so that adhesion between the base material and the cured curable resin composition is satisfactory.

The number-average molecular weight of the PPE in the PPE particles (A) is between 8,000 and 40,000. The preferred range for the number-average molecular weight is between 8,500 and 30,000, and a more preferred range is between 9,000 and 25,000.

A number-average molecular weight of 8,000 or greater is preferred since this will tend to provide satisfactory dielectric characteristics, water absorption resistance, soldering heat resistance and adhesion (for example, interlayer peel strength in multilayer boards, or peel strength between copper foils and the cured curable resin composition) for the cured product, which are desirable for high-frequency electronic circuit boards. The number-average molecular weight of the PPE in the PPE particles (A) is also preferably no greater than 40,000 because this will tend to lower the melt viscosity of the curable resin composition during molding and result in satisfactory moldability.

The percentage of the number of particles with long diameters of between 0.3 μm and 200 μm with respect to the total number of the PPE particles (A) is preferably 60% or greater, also preferably 70% or greater, preferably 80% or greater, preferably 90% or greater, preferably 95% or greater and preferably 98% or greater. The upper limit is preferably no greater than 100%.

The percentage of the number of particles with long diameters of between 1.0 μm and 100 μm with respect to the total number of the PPE particles (A) is preferably 60% or greater, also preferably 70% or greater, preferably 80% or greater, preferably 90% or greater, preferably 95% or greater and preferably 98% or greater. The upper limit is preferably no greater than 100%.

The percentage of the number of particles with long diameters of between 3 μm and 20 μm with respect to the total number of the PPE particles (A) is preferably 60% or greater, also preferably 70% or greater, preferably 80% or greater, preferably 90% or greater, preferably 95% or greater and preferably 98% or greater. The upper limit is preferably no greater than 100%.

The percentage of the number of particles with long diameters of between 0.3 μm and 30 μm with respect to the total number of the PPE particles (A) is preferably 60% or greater, also preferably 70% or greater, preferably 80% or greater, preferably 90% or greater, preferably 95% or greater and preferably 98% or greater. The upper limit is preferably no greater than 100%.

The percentage of the number of particles with long diameters of between 0.3 μm and 20 μm with respect to the total number of the PPE particles (A) is preferably 60% or greater, also preferably 70% or greater, preferably 80% or greater, greater, preferably 90% or greater, preferably 95% or greater and preferably 98% or greater. The upper limit is preferably no greater than 100%.

The percentage of the number of particles with long diameters of between 0.3 μm and 3 μm with respect to the total number of the PPE particles (A) is preferably 60% or greater, also preferably 70% or greater, preferably 80% or greater, preferably 90% or greater, preferably 95% or greater and preferably 98% or greater. The upper limit is preferably no greater than 100%.

It is conjectured that, among these ranges, if at least 80% of the total number of PPE particles have sizes of 0.3 μm or greater and at least 60% of the total number of PPE particles have sizes of 1.0 μm or greater, then this allows the melting rate of the PPE particles during hot pressure molding to be appropriately slower compared to the thermosetting resin composition other than the PPE particles, but it is preferred for satisfactory adhesion between the base material and the cured curable resin composition of the cured complex described below.

Another presumed reason is that if at least 80% of the total number of PPE particles have sizes of no greater than 200 μm and at least 60% of the total number of PPE particles have sizes of up to 100 μm, the PPE component in the PPE particles completely melts under ordinary hot pressing conditions, and this is preferred because it allows the curable resin component to sufficiently fill the voids of the base material (for example, between filaments of a filamentous substrate such as a glass cloth), and the irregularities in the wiring. Sufficient melting of the PPE component in the PPE particles is preferred from the viewpoint of inhibiting molding defects such as voids and thin spots.

According to the first embodiment, the PPE particles (A) extracted from the prepreg with a toluene/methanol mixed solvent at a mass ratio of 95:5 are preferably composed of primary particles (A'). In the primary particles (A'), the percentage of the number of particles with long diameters of between 0.3 μm and 200 μm among the total number of particles, the percentage of the number of particles with long diameters of between 1.0 μm and 100 μm among the total number of particles, the percentage of the number of particles with long diameters of between 3 μm and 20 μm among the total number of particles, the percentage of the number of particles with long diameters of between 0.3 μm and 30 μm among the total number of particles, the percentage of the number of particles with long diameters of between 0.3 μm and 20 μm among the total number of particles, and the percentage of the number of particles with long diameters of between 0.3 μm and 3 μm among the total number of particles, are preferably in the same percentage ranges as for the PPE particles (A).

It is conjectured that, among these ranges, if at least 80% of the total number of PPE primary particles have sizes of between 0.3 µm and 30 µm, and at least 60% of the total number of PPE primary particles have sizes of between 0.3 µm and 20 µm, then this allows the melting rate of the PPE particles during hot pressure molding to be appropriately slower compared to the thermosetting resin composition other than the PPE particles, but it is preferred for satisfactory adhesion between the base material and the cured curable resin composition of the cured complex described below.

Also, presumably if at least 80% of the PPE primary particles have sizes of no greater than 30 µm and at least 60% of the PPE primary particles have sizes of up to 20 µm, then it will be possible to rapidly limit the melting rate of the PPE component in the PPE particles (A) to within a suitable range, thereby allowing uniform compatibilization between the PPE component that has melted with a delay compared to the PPE particles (A), and the thermosetting resin components other than the PPE particles (A), and contributing to improved adhesion.

In addition, preferably at least 60% of the PPE primary particles have sizes of between 0.3 µm and 3 µm, since this will result in excellent stability of the electrical characteristics of the cured complex described below, under hygroscopic conditions. While the reason for this is not completely understood, it is possibly due to the fact that the difference between the melting rate of the PPE particles and the melting rate of the thermosetting resin composition other than the PPE particles during hot pressure molding is optimal for satisfactory impregnation of the curable resin composition into the base material and adhesion between the curable resin composition and the base material, and that moisture absorption into the boundary region between the curable resin composition and the base material is minimized.

The maximum diameter of the PPE particles (A) or primary particles (A') is preferably no greater than 40 µm, more preferably no greater than 30 µm, even more preferably no greater than 20 µm and most preferably no greater than 8 µm. The lower limit is preferably at least 0.5 µm.

This is presumably because if the maximum diameter is no greater than 40 µm, the PPE component in the PPE primary particles completely melts under ordinary hot pressing conditions, and this is preferred because it allows the curable resin component to sufficiently fill the voids of the base material (for example, between filaments of a filamentous substrate such as a glass cloth), and the irregularities in the wiring. Sufficient melting of the PPE component in the PPE particles is preferred from the viewpoint of inhibiting molding defects such as voids and thin spots.

The lower limit for the maximum diameter is preferably at least 0.5 µm from the viewpoint of more satisfactorily exhibiting an excellent effect of adhesion between the base material and the cured curable resin composition.

According to the first embodiment, PPE extracted from the prepreg with a toluene/methanol mixed solvent at a mass ratio of 95:5 preferably also contains dissolved PPE (B), which is soluble in the mixed solvent, in addition to the PPE particles (A) that are insoluble in the mixed solvent.

Also, the mixing ratio of the PPE particles (A) and the dissolved PPE (B) is preferably 99:1 to 45:55, more preferably 99:1 to 60:40, even more preferably 99:1 to 75:25 and most preferably 99:1 to 85:15, as the ratio of PPE particles (A):dissolved PPE (B) (mass ratio).

Preferably, the mass ratio is the same as 99:1 or the proportion of PPE particles (A) is lower, from the viewpoint of reducing resin dust fall-off or resin flaking that occurs during production of the prepreg or during handling of the prepreg. This is believed to be because the thermosetting resin component containing the dissolved PPE (B) lies between the base material and the PPE particles (A).

On the other hand, preferably the mass ratio is 45:55 or the proportion of PPE particles (A) is higher, for satisfactory adhesion between the base material and the cured thermosetting resin composition of the cured complex described below. While the reason for this is not completely understood, it is possible that, as mentioned above, the thermosetting resin component containing the dissolved PPE particles (B) other than the PPE particles (A) melts first during the prepreg hot pressure molding process, thereby covering the surface of the base material and adhering to the base material, but since the amount of the PPE component in the thermosetting resin component at this time can be reduced, adhesion with the base material is reinforced.

Also, the number-average molecular weight of the dissolved PPE (B) is preferably 5,000 to 40,000. A more preferred range for the number-average molecular weight of the dissolved PPE (B) is between 5,500 and 30,000, and an even more preferred range is between 6,000 and 25,000.

The number-average molecular weight of the dissolved PPE (B) is preferably 5,000 or greater for satisfactory electrical characteristics of printed circuit boards produced using the dispersion. The number-average molecular weight of the dissolved PPE (B) is preferably no greater than 40,000 from the viewpoint of obtaining low melt viscosity for the curable resin composition and satisfactory moldability, during molding of the prepreg obtained by impregnating a base material with a varnish containing the PPE particle dispersion.

In the dissolved PPE (B), the number-average molecular weight is preferably between 1,000 and 7,000 and the average number of phenolic hydroxyl groups per molecule is preferably no greater than 0.5.

A more preferred range for the number-average molecular weight of the dissolved PPE (B) is between 1,300 and 5,000, and an even more preferred range is between 1,500 and 4,000. The number-average molecular weight of the dissolved PPE (B) preferably no greater than 7,000 because this will tend to lower the melt viscosity of the curable resin composition and result in satisfactory moldability during hot pressure molding. On the other hand, a number-average molecular weight of 1,000 or greater is preferred since this will tend to allow maintenance of satisfactory dielectric characteristics, water absorption resistance, soldering heat resistance and adhesion (for example, interlayer peel strength in multilayer boards, or peel strength between copper foils and the cured curable resin composition) for the cured product, which are desirable for high-frequency electronic circuit boards.

According to the first embodiment, the PPE component in the prepreg is preferably between 10 mass % and 70 mass % based on 100 mass % as the mass of the curable resin composition in the prepreg. The preferred range for the percentage of the PPE component in the curable resin composition is between 13 mass % and 60 mass %, and an even more preferred range is between 15 mass % and 50 mass %.

The percentage of the PPE component among the curable resin components in the prepreg is the value determined by the following method.

First, the amount of the curable resin composition in the prepreg is determined by the following method. A 50 g portion of chloroform at 23° C.±2° C. is added to 2.5 g of the prepreg. After allowing 1 hour to pass in a thermostatic chamber at 23° C.±2° C. while vigorously shaking every 5 minutes, the curable resin composition dissolved in the chloroform is recovered by filtration. Next, 50 g of chloroform at 23° C.±2° C. is added to the extraction residue, and after 1 hour in a thermostatic chamber at 23° C.±2° C. while vigorously shaking every 5 minutes in the same manner, the curable resin composition dissolved in the chloroform is recovered by filtration. The two recovered chloroform solution batches are combined and the solvent is removed to obtain a curable resin composition, and the weight is measured as the mass of the curable resin composition in 2.5 g of prepreg.

Also, the amount of PPE component in the prepreg is calculated as the sum of the mass of PPE component in the PPE particles (A), calculated from the mass of the PPE particles (A) in 2.5 g of prepreg and the PPE content of the PPE particles (A), and the mass of the dissolved PPE (B) in 2.5 g of prepreg, determined by the method described below.

The mass ratio of the PPE component with respect to the curable resin composition is calculated from the mass of the curable resin composition and the mass of the PPE component in 2.5 g of prepreg, obtained by the method described above.

The percentage of the PPE component in the resin composition is preferably at least 10 mass %, because the PPE content will increase in the printed circuit board obtained by hot pressure molding of the prepreg and a printed circuit board with excellent electrical characteristics will be obtained. The percentage of PPE component in the resin composition is preferably no greater than 70%, because this will prevent excessive increase in the melt viscosity of the PPE particle-containing prepreg during the hot pressure molding process and a homogeneous, satisfactory molded article will be obtained.

There is no particular restriction on the average number of phenolic hydroxyl groups per PPE molecule in the PPE of first embodiment.

For example, the average number of phenolic hydroxyl groups per PPE molecule may be set to be less than 0.5. It is more preferably no greater than 0.2 and even more preferably no greater than 0.1. The average number of phenolic hydroxyl groups is preferably less than 0.5, because this will allow formation of a cured product with low permittivity and a low dielectric loss tangent even when using PPE of relatively low molecular weight. It is also preferred because it will minimize curing inhibition by phenolic hydroxyl groups, so as to obtain a cured product with satisfactory curing reactivity and with excellent mechanical properties and heat resistance. A low average number of phenolic hydroxyl groups is preferred, and it may even be zero, but the lower limit will generally be about 0.001 from the viewpoint of allowing modification of phenolic hydroxyl groups with other functional groups.

The average number of phenolic hydroxyl groups per PPE molecule may also be set to be 0.3 or greater. It is preferably 0.7 or greater, more preferably 0.9 or greater and even more preferably 1.05 or greater. By using PPE with an average number of phenolic hydroxyl groups of 0.3 or greater per molecule in the curable resin composition, the adhesion between the cured resin composition and the base material (for example, a glass cloth) or the adhesion between the cured resin composition and a metal foil such as a copper foil will be satisfactory, and water absorption resistance and soldering heat resistance of the printed circuit board and the adhesion (for example, the interlayer peel strength for a multilayer board, or the peel strength between the cured product and the copper foil) will be even more satisfactory, and this is therefore preferred. The average number of phenolic hydroxyl groups is preferably no greater than 2.0, more preferably no greater than 1.85 and even more preferably no greater than 1.6, from the viewpoint of minimizing increase in the water absorbing property of the complex comprising the cured curable resin composition and the base material (for example, a laminated sheet) or from the viewpoint of minimizing increase in the permittivity and dielectric loss tangent of the complex.

The average number of phenolic hydroxyl groups per PPE molecule can be adjusted, for example, by mixing PPE having residual molecular terminal phenolic hydroxyl groups and PPE having molecular terminal phenolic hydroxyl groups modified with other functional groups, and adjusting their mixing ratio. Alternatively, it can be adjusted by changing the degree of substitution of the molecular terminal phenolic hydroxyl groups with other functional groups. The types of such functional groups are not particularly restricted, and they may be benzyl, allyl, propargyl, glycidyl, vinylbenzyl, methacryl or the like. Among these, the functional groups are preferably benzyl groups from the viewpoint of satisfactory reaction efficiency, ready commercial availability, low inherent reactivity and excellent stability, and obtaining a notable effect of reducing the melt viscosity of the PPE-containing composition during press molding. Alternatively, there may be suitably used allyl, propargyl, glycidyl, vinylbenzyl or methacryl groups, from the viewpoint of allowing formation of crosslinking reaction during the hot pressure molding process and obtaining a cured product with excellent mechanical properties and heat resistance.

<Other Components>

The curable resin composition preferably contains a crosslinking curable component (C) in addition to the aforementioned PPE.

The crosslinking curable component (C) is preferably a monomer having two or more unsaturated groups in the molecule. The resin dispersion may contain the crosslinking curable component (C) at preferably 5 to 95 parts by weight, more preferably 10 to 80 parts by weight, even more preferably 10 to 70 parts by weight and most preferably 20 to 70 parts by weight, with respect to 100 parts by weight of the PPE (A). If the amount of the crosslinking curable component (C) is at least 5 parts by weight, it will be possible to satisfactorily reduce the melt viscosity of the resin composition, resulting in satisfactory moldability by hot pressure molding and the like, and to increase the heat resistance of the resin composition. On the other hand, if the amount of the crosslinking curable component (C) is no greater than 95 parts by weight, it will be possible to exhibit the excellent permittivity and dielectric loss tangent of PPE.

Monomers having two or more unsaturated groups in the molecule include triallyl isocyanurate (TAIL), triallyl cyanurate (TAO), trimethallyl cyanurate, trimethylolpropane trimethacrylate, divinylbenzene, divinylnaphthalene, diallyl phthalate, diallyl cyanurate and the like, among which TAIL is preferred for satisfactory compatibility with PPE.

The curable resin composition preferably further contains an initiator (D) for the crosslinking curable component (C).

The initiator (D) used may be any initiator capable of promoting polymerization reaction of vinyl monomers, and examples include peroxides such as benzoyl peroxide, cumene hydroperoxide, 2,5-dimethylhexane-2,5-dihydroperoxide, 2,5-dimethyl-2,5-di(t-butylperoxy)hexyne-3, di-t-butyl peroxide, t-butylcumyl peroxide, α,α'-bis(t-butylperoxy-m-isopropyl)benzene, 2,5-dimethyl-2,5-di(t-butylperoxy)hexane, dicumyl peroxide, di-t-butyl peroxyisophthalate, t-butyl peroxybenzoate, 2,2-bis(t-butylperoxy)butane, 2,2-bis(t-butylperoxy)octane, 2,5-dimethyl-2,5-di(benzoylperoxy)hexane, di(trimethylsilyl)peroxide and trimethylsilyltriphenylsilyl peroxide. Radical generators such as 2,3-dimethyl-2,3-diphenylbutane may also be used as reaction initiators. Preferred among these are 2,5-dimethyl-2,5-di(t-butylperoxy)hexyne-3, α,α'-bis(t-butylperoxy-m-isopropyl)benzene and 2,5-dimethyl-2,5-di(t-butylperoxy)hexane, from the viewpoint of obtaining a cured product with excellent heat resistance and mechanical properties, low permittivity and a low dielectric loss tangent.

The amount of initiator (D) used may be set as appropriate, but generally it is preferably 1.0 part by weight or greater, more preferably 3.0 parts by weight or greater and even more preferably 5.0 parts by weight or greater with respect to 100 parts by weight of the crosslinking curable component (C) from the viewpoint of satisfactorily promoting the polymerization reaction, while from the viewpoint of maintaining low permittivity and a low dielectric loss tangent for the cured product, it is preferably no greater than 25 parts by weight, more preferably no greater than 20 parts by weight and even more preferably no greater than 10 parts by weight.

The curable resin composition may also contain another resin different from PPE (A) (for example, a thermoplastic resin or curable resin).

Examples of thermoplastic resins include homopolymers of vinyl compounds such as ethylene, propylene, butadiene, isoprene, styrene, divinylbenzene, methacrylic acid, acrylic acid, methacrylic acid ester, acrylic acid ester, vinyl chloride, acrylonitrile, maleic anhydride, vinyl acetate and ethylene tetrafluoride, and copolymers of two or more of these vinyl compounds, as well as polyamides, polyimides, polycarbonates, polyesters, polyacetals, polyphenylene sulfides, polyethylene glycols and the like. Preferred for use among these are styrene homopolymers, styrene-butadiene copolymer and styrene-ethylene-butadiene copolymer, from the viewpoint of solubility and moldability in the solvent of the resin composition.

Examples of curable resins include phenol resins, epoxy resins and cyanate esters. The thermoplastic resin and curable resin may also be modified with a functional compound such as an acid anhydride, epoxy compound, amine or the like.

The amount of such other resins to be used is preferably 10 parts by weight or greater, more preferably 15 parts by weight or greater and even more preferably 20 parts by weight or greater with respect to 100 parts by weight of the PPE (A), and from the viewpoint of exhibiting the excellent dielectric characteristics and heat resistance of PPE, it is preferably no greater than 90 parts by weight, more preferably no greater than 70 parts by weight and even more preferably no greater than 50 parts by weight.

When an epoxy resin is to be used as another resin component, in order to reflect the excellent dielectric characteristic of PPE in the curable resin composition, the range of the epoxy resin in the curable resin composition is preferably between 0% and 10%, with the range of between 0.1% and 10% being more preferred from the viewpoint of increasing adhesion.

The curable resin composition may further contain appropriate additives according to the purpose. Such additives may include flame retardants, heat stabilizers, antioxidants, UV absorbers, surfactants, lubricants, fillers, polymer additives and the like. It is particularly preferred for the resin composition to also contain a flame retardant, from the viewpoint of imparting flame retardance in addition to the advantages of obtaining a printed circuit board with satisfactory moldability, water absorption resistance and soldering heat resistance and excellent adhesion (for example, interlayer peel strength in multilayer boards or peel strength between the cured product and copper foils and the like).

The flame retardant is not particularly restricted so long as it has the function of inhibiting combustion mechanisms, and there may be mentioned inorganic flame retardants such as antimony trioxide, aluminum hydroxide, magnesium hydroxide and zinc borate, aromatic bromine compounds such as hexabromobenzene, decabromodiphenylethane, 4,4-dibromobiphenyl, ethylene bistetrabromophthalimide, and phosphorus-based flame retardants such as resorcinol bis-diphenyl phosphate and resorcinol bis-dixylenyl phosphate. Decabromodiphenylethane is preferred among these from the viewpoint of maintaining low permittivity and a low dielectric loss tangent for the obtained cured product.

The amount of flame retardant used will differ depending on the flame retardant used and is not particularly restricted, but from the viewpoint of maintaining flame retardance at a UL standard 94V-0 level, it is preferably 5 parts by weight or greater, more preferably 10 parts by weight or greater and even more preferably 15 parts by weight or greater with respect to 100 parts by weight as the total of the functional group-added PPE (A) and the crosslinking curable component (C). Also, from the viewpoint of maintaining low permittivity and a low dielectric loss tangent for the obtained cured product, the amount used is preferably no greater than 50 parts by weight, more preferably no greater than 45 parts by weight and even more preferably no greater than 40 parts by weight.

Other various additives include heat stabilizers, antioxidants, UV absorbers, surfactants, lubricants, fillers, polymer additives and the like. The amounts of such additives used may be appropriately set by a person skilled in the art as desired.

<Prepreg>

The prepreg of the first embodiment is typically a prepreg for an electronic circuit board. By using each of the aforementioned components, adhesion between the PPE-containing curable resin composition and the base material will be satisfactory, making it possible to provide a prepreg for an electronic circuit board that can yield a cured product having low resin dust fall-off and resin flaking during production and handling, as well as excellent adhesion by hot pressure molding (for example, interlayer peel strength for multilayer boards, or peel strength between cured curable resin compositions and metal foils such as copper foils), moisture absorption resistance, heat resistance and stability of electrical characteristics under hygroscopic conditions. PPE characteristically has poor adhesion with base materials and metal foils. Low molecularization of PPE to increase the number of terminal hydroxyl groups can potentially improve adhesion, but this tends to impair the original excellent electrical characteristics of PPE. The prepreg of this embodiment can maintain the excellent electrical characteristics of PPE while increasing adhesion. Using each of the components mentioned above is preferred, as this will tend to provide excellent solubility and dispersibility in aromatic organic solvents at ordinary temperature and satisfactory handleability, as well as excellent molten resin flow properties.

A typical prepreg can be produced as a complex of a curable resin composition and a base material, by impregnating a resin varnish containing the curable resin composition into the base material and then volatilizing the solvent component by hot air drying or the like.

the base material used may be any of various glass cloths such as a roving cloth, cloth, chopped mat or surfacing mat; an asbestos cloth, metal fiber cloth or other synthesis or natural inorganic fiber cloth; a woven fabric or nonwoven fabric obtained from liquid crystal fibers such as total aromatic polyamide fibers, total aromatic polyester fibers or polybenzooxazole fibers; a natural fiber cloth such as cotton cloth, hemp cloth or felt; a natural cellulose-based substrate such as a carbon fiber fabric or a fabric obtained from kraft paper, cotton paper, paper-glass composite yarn or the like, or a polytetrafluoroethylene porous film, either alone or in combinations of two or more.

The proportion of curable resin composition in the prepreg is preferably 30 to 80 parts by weight and more preferably 40 to 70 parts by weight with respect to 100 parts by weight of the total prepreg. If the proportion is at least 30 parts by weight, excellent insulating reliability will be obtained when the prepreg is used to form an electronic board, for example, and if it is no greater than 80 parts by weight, the obtained electronic board will have excellent mechanical properties such as flexural modulus.

The method used to fabricate the prepreg may be a method of coating the base material with a varnish in which the PPE particles are dispersed.

There are no particular restrictions on the method of obtaining the varnish with the PPE particles (A) dispersed therein.

For example, it may be a method in which PPE particles are dispersed in an organic solvent or PPE is pulverized in an organic solvent to form a dispersion of PPE particles with a prescribed particle size (hereunder referred to as "crushing dispersion method"), or a method in which PPE is added to a halogen-free solvent and then heated to dissolve the PPE, and the temperature is then lowered (hereunder referred to as "crystallization method"). The aforementioned method of obtaining a varnish in which the PPE particles (A) are dispersed is preferred since the PPE particles are in a stable state, allowing a prepreg to be stably produced.

The particle size of the PPE particles (A) in the prepreg, the PPE content ratio, the PPE molecular weight and the mass ratio of the PPE particles (A) and dissolved PPE (B) can be adjusted, for example, by pre-adjusting the PPE particles to be added to the organic solvent, or by varying the crushing power in the organic solvent, in the "crushing dispersion method" described below. Also, in the "crystallizing dispersion method" described below, it can be adjusted by varying the PPE concentration, the PPE molecular weight, the co-presence and amount of other substances, the temperature lowering speed and the stirring power.

[Crushing Dispersion Method]

The particle size adjusting method may be pulverization or screening in a wet system or dry system. These methods may also be combined.

The solvent used is preferably a mixed solvent of solvent (a) having a PPE solvent retention of at least 1500% and a solvent (b) having a PPE solvent retention of no greater than 300%, and the mass ratio (a):(b) is preferably 90:10 to 99.9:0.1. A more preferred range for the mixed mass ratio (a):(b) of the solvent (a) with a solvent retention of at least 1500% and the solvent (b) of no greater than 300% is 93:7 to 99.5:0.5, and an even more preferred range is 94:6 to 99.2:0.8.

Here, the PPE solvent retention refers to the value determined by the following method.

Approximately 80 g of solvent at 23° C.±2° C. is added to PPE, WO (g)(5±0.1 g) and the mixture is stirred for 2 hours or longer with a magnetic stirrer in a thermostatic chamber at 23° C.±2° C., to prepare a uniform dispersion. The obtained dispersion is transferred to a 100 cm³ precipitation tube, the solvent is added to a total of 100 cm³, and the dispersion is gently stirred to uniformity, after which it is allowed to stand for 24 hours in a thermostatic chamber at 23° C.±2° C.

Next, the supernatant liquid from the upper and lower separated layers is removed, the mass W of the lower layer (the amount of PPE and the solvent retained by the PPE).

The solvent retention is calculated by the following formula:

$$\text{Solvent retention}(\%) = 100 \times (W - WO)/WO$$

using the mass WO of the obtained PPE and the combined mass W of the PPE and the solvent retained by the PPE.

In cases where the homogeneous solution or dispersion does not separate into two layers after standing for 24 hours, the solvent retention is considered to be ≥1900%.

Preferably, the mixed mass ratio (a):(b) of the solvent (a) with a solvent retention of at least 1500% and the solvent (b) of no greater than 300% is the same as 90:10, or (a) is greater, because the PPE will be sufficiently swelled even though the solvent retention of the PPE particles (A) in the PPE dispersion is high and it has dispersion stability. It is also preferred because, since presumably the molecular chains on the PPE particle surfaces are loosened, the adhesion of the PPE particles is increased, and therefore the prepreg fabricated using the PPE particle dispersion and the cured product formed by hot pressure molding of the prepreg have more satisfactory adhesion with the base material and the resin component. Preferably, (a):(b) is the same as 99.9:0.1 or (a) is smaller, because excessive swelling of the PPE particles will be inhibited and it will be possible to ensure the flow property of the PPE particle dispersion.

A solvent such that the PPE solvent retention is at least 1500% is not particularly restricted, but an aromatic organic solvent or the like is preferred for use so that a solvent retention of at least 1500% can be easily obtained regardless of the type or molecular weight of the PPE. As preferred examples, there may be used benzene, toluene or xylene alone, or mixtures of two or more thereof may be used. A solvent such that the PPE solvent retention is no greater than 300% is also not particularly restricted, but polar solvents such as alcohols and ketones are preferably used so that a solvent retention of no greater than 300% can be easily obtained regardless of the type or molecular weight of the PPE. As preferred examples there may be used methanol, ethanol, isopropyl alcohol, methyl ethyl ketone or the like alone, or mixtures of two or more thereof may be used.

Dispersion in such organic solvents is preferably carried out at a temperature within no more than 10° C. of the coating temperature. This can avoid loss of homogeneity due to increase in deposition of the PPE during storage periods before coating or during coating, that results in viscosity increase or variation.

The method for crushing the PPE in the organic solvent and preparing a varnish with the PPE dispersed in the organic solvent may be as follows.

There are no particular restrictions on the solvent used, but it is preferred to use the solvent (a) in which the PPE solvent retention is at least 1500% and the solvent (b) in which the PPE solvent retention is no greater than 300%, at a mixing ratio such that mass ratio (a):(b) is 90:10 to 99.9:0.1, in order to maintain the flow properties and dispersion stability of the PPE particles, and obtain a prepreg with excellent coating properties on the base material and excellent adhesion between the base material and the resin composition containing the PPE particles. The solvent in which the PPE solvent retention is at least 1500% may be an aromatic organic solvent such as benzene, toluene or xylene, for example, either used alone or in mixtures of two or more. Also, the solvent in which the PPE solvent retention is no greater than 300% may be a ketone such as methyl ethyl ketone or methyl isobutyl ketone or an alcohol such as methanol, ethanol or butanol, for example, either used alone or in mixtures of two or more. These solvents may be selected for use as appropriate depending on the PPE used.

If the solvent in which the PPE solvent retention is at least 1500% is at or above a certain level, the PPE particles will swell by taking up the solvent into the particles, thereby increasing the viscosity, increasing the dispersion stability and allowing a greater coating amount (resin content) on the base material. It also equalizes the resin component dissolved in the solvent and the resin component in the swelled PPE particles, and stabilizes impregnation into the base material to allow uniform coating. If the swelling property is insufficient, the PPE particles become filtered through the base material/glass cloth/woven fabric structure at the varnish-impregnated sections, thereby accumulating on the impregnation roll. On the other hand, if the solvent in which the PPE solvent retention is at least 1500% is limited to no greater than a certain level, this will minimize gelling and solidification of the PPE particles by swelling and allow coating, while also minimizing progressive swelling and gelling and resulting in excellent storage stability.

[Crystallizing Dispersion Method]

For a method of obtaining PPE crystal grains by adding PPE to a halogen-free solvent, heating the mixture to dissolution and then lowering the temperature, particles may be obtained using a PPE solution containing PPE at a solid content of 70 mass % or greater, and lowering the temperature. Preferably, the content of particles with long diameters of between 3 μm and 20 μm is at least 60% from the viewpoint of obtaining suitable viscosity for coating. Also, preferably the long diameter/short diameter ratio of the particles is in a range of between 1.0 and 1.2 from the viewpoint of obtaining suitable viscosity for coating, and also from the viewpoint of easily obtaining flow properties and increasing the PPE particle concentration of the varnish.

In addition, a higher proportion of PPE in the PPE solution with respect to the dissolved components is preferred from the viewpoint of allowing the PPE concentration of the PPE particles to be increased and more easily obtaining PPE particles according to the first embodiment. The PPE solution may further contain, in addition to PPE, an additive such as a polystyrene resin or a hydrogenated block copolymer obtained by hydrogenation of a block copolymer comprising a polymer block A composed mainly of one type of vinyl aromatic compound and a polymer block B composed mainly of at least one type of conjugated diene compound. Also, the PPE solution may contain a component with a melting point of 30° C. or higher, to obtain a PPE crystal solution with flow properties in a stable reproducible manner.

The temperature lowering is preferably carried out in a vessel provided with a stirring blade. The temperature is lowered which stirring the PPE dissolved in a halogen-free solvent, to produce a PPE particle dispersion. It is preferred for the stirring to be at a blade tip speed of no greater than 3 m/s when the temperature reaches at least 10° C. higher than the temperature at which the PPE crystal grains begin to be deposited, in order to prevent particle aggregation and viscosity increase of the dispersion. Also, the temperature lowering may be conducted in a stationary state from the viewpoint of more easily controlling the obtained PPE particles into large spherical shapes and increasing the flow properties of the dispersion, or allowing the PPE content to be increased.

The target temperature for temperature lowering may be near the temperature at which the varnish is to be impregnated into the base material, and for example, if the coating temperature is represented as $\alpha°$ C., it is preferably a temperature of between $\alpha-15°$ C. and $\alpha+10°$ C., in order to more easily control the mass ratio of the PPE particles (A) and dissolved PPE (B) and obtain a stabilized prepreg. A more preferred range for the target temperature for temperature lowering is between $\alpha-10°$ C. and $\alpha+5°$ C., a more preferred temperature range is between $\alpha-5°$ C. and $\alpha+4°$ C., and the most preferred temperature range is between $\alpha-3°$ C. and $\alpha+3°$ C.

The temperature condition for forming a varnish from the resin dispersion obtained in this manner is preferably a temperature of between the target temperature for temperature lowering during preparation of the resin dispersion, and the coating temperature, in order to facilitate control of the mass ratio of the PPE particles (A) and dissolved PPE (B), but it is not particularly restricted so long as it is in a range that allows control of the mass ratio of the PPE particles (A) and dissolved PPE (B).

When a resin varnish is produced by adding other components to the resin dispersion, the addition rate for the other components is preferably addition at a rate of no greater than 0.6 part by weight per minute, based on 100 parts by weight of the total PPE content in the dispersion, from the viewpoint of preventing aggregation of the resin.

The solvent used in the dispersion preferably has a PPE solubility of between 3 mass % and 20 mass % at a temperature of 25° C. The PPE solubility at a temperature of 80° C. is more preferably at least 20 mass % and even more preferably 30 mass % or greater. So long as the PPE dissolving properties are satisfied there are no particular restrictions, but the liquid mixture may be of one type or a mixture of two or more. Preferred solvents include aromatic organic solvents such as benzene, toluene and xylene, ketones such as cyclohexanone, methyl ethyl ketone and methyl isobutyl ketone, and alcohols such as methanol, ethanol and butanol.

<Curable Resin Composition Complex>

The prepreg may be used to form a laminated sheet with a laminated metal foil. The laminated sheet preferably has the cured complex and metal foil stacked and bonded, and it can be suitably used as a material for an electronic board. The metal foil used may be an aluminum foil or copper foil, for example, with a copper foil being preferred for low electrical resistance. The cured complex to be combined with the metal foil may consist of one sheet or several sheets, and the metal foil may be stacked on one side or both sides of the complex and the laminated sheet processed, according to the purpose. The method for producing the laminated sheet may be a method in which, for example, the prepreg and the metal foil are stacked and then the curable resin composition is cured, to obtain a laminated sheet in which the cured product layered body and metal foil are laminated. One particularly preferred use for the laminated sheet is as an electronic circuit board.

The second embodiment is a laminated sheet composed of a low-dielectric resin and a base material.

According to the second embodiment, the laminated sheet satisfies the following conditions.

(1) The dielectric loss tangent is no greater than 0.007 at 10 GHz (cavity resonance method).

(2) The metal foil peel strength with a metal foil that has a side with a surface smoothness of no greater than Rz 2.0 µm is 0.6 N/mm or greater.

(3) The coefficient of linear thermal expansion (≤Tg) is between 20 ppm/K and 60 ppm/K.

(4) The peel strength between the low-dielectric resin and the base material is between 0.8 and 1.8 times the metal foil peel strength.

By being provided with all of the aforementioned properties, an electronic circuit board in which a circuit is formed by a low-roughness metal foil on a board composed of a low-dielectric resin and a base material will not have concentration of stress during production processing (for example, drilling and solder reflow) or during handling, thereby making it resistant to cracking near the base material or near the conductor. This can reduce dielectric loss and conductor loss in the high-frequency range in addition to using a low-roughness metal foil, and can provide an electronic circuit board with excellent transmission characteristics and insulating reliability.

The method for reducing the skin resistance of the conductor (metal wiring or the like) may be a method of lowering the surface roughness of the conductor, but since low-dielectric resins generally have low polarity and unsatisfactory adhesion with conductors, when the surface roughness of the conductor is lowered to reduce the anchor effect, adhesion of the resin with the conductor is further reduced, making it impossible to ensure the required peel strength between the resin and the conductor. In addition, since a low-dielectric resin will generally have low polarity and a relatively rigid structure, the problem arises that the resin itself is relatively fragile, and cohesive fracture tends to occur by stress acting near the base material or metal foil, due to thermal load, moisture absorption load and mechanical load, such that cracking tends to occur. Although the technologies described in PTLs 9 to 11 are designed to improve adhesion between low-dielectric resins and metal foils, and it is reported that such improvement is possible, these have not been developed from the viewpoint of overcoming detachment between the low-dielectric resin and base material, cracking of the resin near the base material, and cracking of the resin near the metal foil.

<Laminated Sheet>

In a laminated sheet according to the second embodiment, the dielectric loss tangent at 10 GHz is no greater than 0.007. The preferred range for the dielectric loss tangent is no greater than 0.006, more preferably no greater than 0.005 and even more preferably no greater than 0.004.

A smaller dielectric loss tangent is desired for the laminated sheet in order to minimize dielectric loss, but since a low-dielectric resin has low polarity and a relatively rigid structure, the resin itself is fragile and it tends to lack adhesion with components such as the filler in the resin, this tendency being greater with low-dielectric resins having lower dielectric loss tangents. Consequently, when a dielectric resin with a low dielectric loss tangent is used to form a laminated sheet, it is unable to withstand stress concentration near the base material and near the metal foil under thermal load, moisture absorption load and mechanical load during production processing (for example, drilling and solder reflow) and during handling, and it becomes difficult to minimize cracking.

With the construction described above, overall stress is alleviated without being concentrated near the base material or metal foil, and therefore even when a low-dielectric resin with a dielectric loss tangent of 0.007 or lower is used, it is possible to obtain a highly reliable laminated sheet that is resistant to cracking under thermal load, moisture absorption load and mechanical load, and this is therefore preferred.

In the laminated sheet described above, the metal foil peel strength of the laminated sheet with a metal foil that has a side with a surface smoothness of no greater than Rz 2.0 µm is 0.6 N/mm or greater. A preferred range for the metal foil peel strength is 0.8 N/mm or greater, and a more preferred range is 1.0 N/mm or greater.

If the metal foil peel strength is 0.6 N/mm or greater, adhesion between the low-dielectric resin and the metal foil will be firmly maintained, and this is therefore preferred to help prevent peeling and blistering of the metal foil under thermal load, moisture absorption load and mechanical load in the production processing steps.

Also, the peel strength between the base material and the low-dielectric resin in the laminated sheet is preferably 0.6 N/mm or greater. A more preferred range for the peel strength between the base material and the low-dielectric resin is 0.8 N/mm or greater, a more preferred range is 1.0 N/mm or greater and the most preferred range is 1.2 N/mm or greater.

The peel strength between the base material and the low-dielectric resin is preferably at least 0.6 N/mm because this will minimize delamination between the layers during production and handling of the laminated sheet. Although stronger peel strength between the base material and the low-dielectric resin is preferred from the viewpoint of preventing delamination, as mentioned above, it is preferred to adjust the strength ratio with the metal foil peel strength to within the following specified range in order to adequately exhibit an effect of minimizing resin cracking.

In a laminated sheet, the ratio between the metal foil peel strength and the peel strength between the base material and the low-dielectric resin (peel strength between laminated sheet base material and low-dielectric resin/laminated sheet copper foil peel strength) (hereunder referred to simply as "peel strength ratio") is between 0.8 and 1.8. A preferred range for the peel strength ratio is between 1.05 and 1.8, a more preferred range is between 1.3 and 1.8 and an even more preferred range is between 1.3 and 1.6.

The peel strength ratio is preferably within this range to help prevent cracking of the resin near the base material or near the metal foil under thermal load, moisture absorption load and mechanical load during the production processing steps. While the reason for this is not completely understood, it is conjectured that stress generated due to thermal load, moisture absorption load and mechanical load during the production processing steps is not concentrated near the base material or near the metal foil, and can be diffused across the entire laminated sheet.

The coefficient of linear thermal expansion (Tg) of the laminated sheet is between 20 ppm/K and 60 ppm/K. A preferred range for the coefficient of linear thermal expansion is between 23 ppm/K and 55 ppm/K, and a more preferred range is between 25 ppm and 50 ppm/K.

It is conjectured that this is because when the coefficient of linear thermal expansion is at least 20 ppm/K, stress produced near the base material and the metal foil under thermal load, moisture absorption load and mechanical load during the production processing steps is efficiently diffused and concentration of stress is alleviated, and this is preferred in order to help prevent resin cracking.

It is also conjectured that when the coefficient of linear thermal expansion is no greater than 60 ppm/K deformation of the low-dielectric resin itself is reduced to a minimum, and this is preferred in order to help prevent resin cracking near the base material or near the metal foil under thermal load, moisture absorption load and mechanical load during the production processing steps.

The glass transition temperature (Tg) of the laminated sheet is preferably 180° C. or higher. A more preferred temperature range for the glass transition temperature is 190° C. or higher, an even more preferred range is 200° C. or higher, and the most preferred range is 210° C. or higher.

It is believed that if the glass transition temperature of the laminated sheet is 180° C. or higher, it is possible to steadily maintain the mechanical strength of the low-dielectric resin even when the laminated sheet is exposed to high temperature in the production processing steps, and this is preferred in order to help prevent resin cracking.

<Metal Foil>

According to the second embodiment, it is possible to form a metal foil laminated sheet with a metal foil layered on the aforementioned laminated sheet, for the purpose of circuit formation and the like. The metal foil laminated sheet preferably has the cured complex and metal foil stacked and bonded, and it can be suitably used as a material for an electronic board.

The metal foil used may be an aluminum foil or copper foil, for example, with a copper foil being preferred for low electrical resistance. The layered body to be combined with the metal foil may consist of one sheet or several sheets, and the metal foil may be stacked on one side or both sides of the layered body and the metal foil laminated sheet processed, according to the purpose.

The metal foil preferably has low surface roughness from the viewpoint of reducing conductor loss. A preferred range for the surface roughness is a Rz of no greater than 2 μm, a more preferred range is no greater than 1.5 μm, an even more preferred range is no greater than 1.0 μm, and the most preferred range is no greater than 0.5 μm.

Also, the surface of the metal foil may be subjected to surface treatment such as silane coupling treatment to increase adhesion with the low-dielectric resin.

The thickness of the metal foil is preferably less than 35 μm. It is believed that if the thickness is less than 35 μm, the metal foil easily follows deformation when the low-dielectric resin deforms by stress generated due to thermal load, moisture absorption load and mechanical load during the production processing steps, or by relaxation of stress, such that stress is not easily concentrated between the low-dielectric resin and the metal foil, and this is preferred to help prevent inclusion of cracks.

<Low-Dielectric Resin>

The low-dielectric resin according to the second embodiment is not particularly restricted.

There may be suitably used cyanate resins, polyphenylene ethers, amorphous polyolefins, epoxy resins (preferably low-dielectric epoxy resins modified so as to form crosslinking without generating hydroxyl groups during the crosslinking), liquid crystal polymers, and the like, that have excellent dielectric characteristics. Of these, polyphenylene ether resins are preferred for their excellent dielectric characteristics, heat resistance, adhesion, moisture absorption resistance and workability. For example, a thermosetting resin composition containing the PPE particles as a constituent of the first embodiment may be used in the low-dielectric resin for the second embodiment. Such a thermosetting resin composition has excellent dielectric characteristics and excellent adhesion with base materials and metal foils, and is therefore suitable for satisfying the properties for the second embodiment.

As another example, in the low-dielectric resin of the second embodiment there may be used PPE having thermosetting functional groups at the molecular chain ends with a number-average molecular weight of between 1,000 and 7,000, and an average number of phenolic hydroxyl groups per molecule of between 0.1 and 0.8. A preferred range for the number-average molecular weight is between 1,500 and 5,000, a more preferred range is between 2,000 and 4,000 and an even more preferred range is between 2,500 and 3,500. Also, a preferred range for the phenolic hydroxyl groups per molecule is between 0.1 and 0.6, a more preferred range is between 0.1 and 0.5 and an even more preferred range is between 0.1 and 0.4.

The number-average molecular weight of the PPE and the average number of phenolic hydroxyl groups per molecule are the values described for the first embodiment.

Preferably, the number-average molecular weight is 1,000 or greater and thermosetting functional groups are present at the molecular chain ends, because it will be possible to accomplish adequate crosslinking reaction during the pressing and hot molding process, and to obtain a high glass transition temperature. Also preferably, the number-average molecular weight is no greater than 7,000, because the melt viscosity will be reduced and excellent moldability will be exhibited during the pressing and hot molding process.

In addition, the average number of phenolic hydroxyl groups per molecule is preferably at least 0.1 to ensure adhesion with the base material and metal foil, and preferably no greater than 0.8 for excellent electrical characteristics and moisture absorption resistance.

Unless otherwise specified, the measured values for each of the parameters mentioned above were measured by the measuring methods in the following examples.

EXAMPLES

This embodiments will now be described in further detail by examples, with the understanding that the embodiments are not in any way restricted by the examples. The physical properties mentioned in the examples, comparative examples and test examples were measured by the following methods.

(1) PPE Content of PPE Particles (A), and Mass Ratio Between PPE Particles and Dissolved PPE (B).

[PPE Content Ratio in PPE Particles (A)]

To 2.5 g of prepreg there was added 20 g of a toluene/methanol mixed solvent at a mass ratio of 95:5, at 23° C.±3° C. One hour was allowed to pass in a thermostatic chamber at 23° C.±2° C. while vigorously shaking every 5 minutes. The mixture was then allowed to stand for 24 hours in the same thermostatic chamber. Next, the supernatant liquid was removed, 5 g of a toluene/methanol mixed solvent with a mass ratio of 95:5 was added and the mixture was vigorously shaken, and it was then allowed to stand for 24 hours in the same thermostatic chamber. The supernatant liquid was then removed. After then drying and removing the solvent, it was developed in chloroform, and after filtering out and removing the insoluble portion, the chloroform was removed by drying to obtain an extract (this extract will hereunder be referred to as "extract (A)"). The PPE content of the extract (A) was quantified by carbon nuclear magnetic resonance spectroscopy, and recorded as the PPE content ratio of the PPE particles (A).

Measurement of the PPE content using carbon nuclear magnetic resonance spectroscopy was carried out by the following method. Tetramethylsilane is used as the reference for the chemical shift, defining the peak as 0 ppm. The peak intensities near 16.8, 114.4, 132.5, 145.4 and 154.7 ppm are totaled as the peak for PPE, and the ratio with the peak intensity of tetramethylsilane is calculated as X. Using the value for the standard substance as X1 and the value for the extract (A) as X2, the value of (X2/X1) P 100 can be calculated to measure the PPE content of the extract. The signal deriving from PPE may be at the same position as for the standard substance, with no limitation to the above. For quantitation, poly(2,6-dimethyl-1,4-phenylene ether) with a number-average molecular weight of 15,000 to 25,000 was used as the standard substance, and the peak intensity ratio obtained from an equal amount of measuring sample was used. S202A Grade by Asahi Kasei Chemicals Corp. was used as the poly(2,6-dimethyl-1,4-phenylene ether) with a number-average molecular weight of 15,000 to 25,000.

Figure 1:
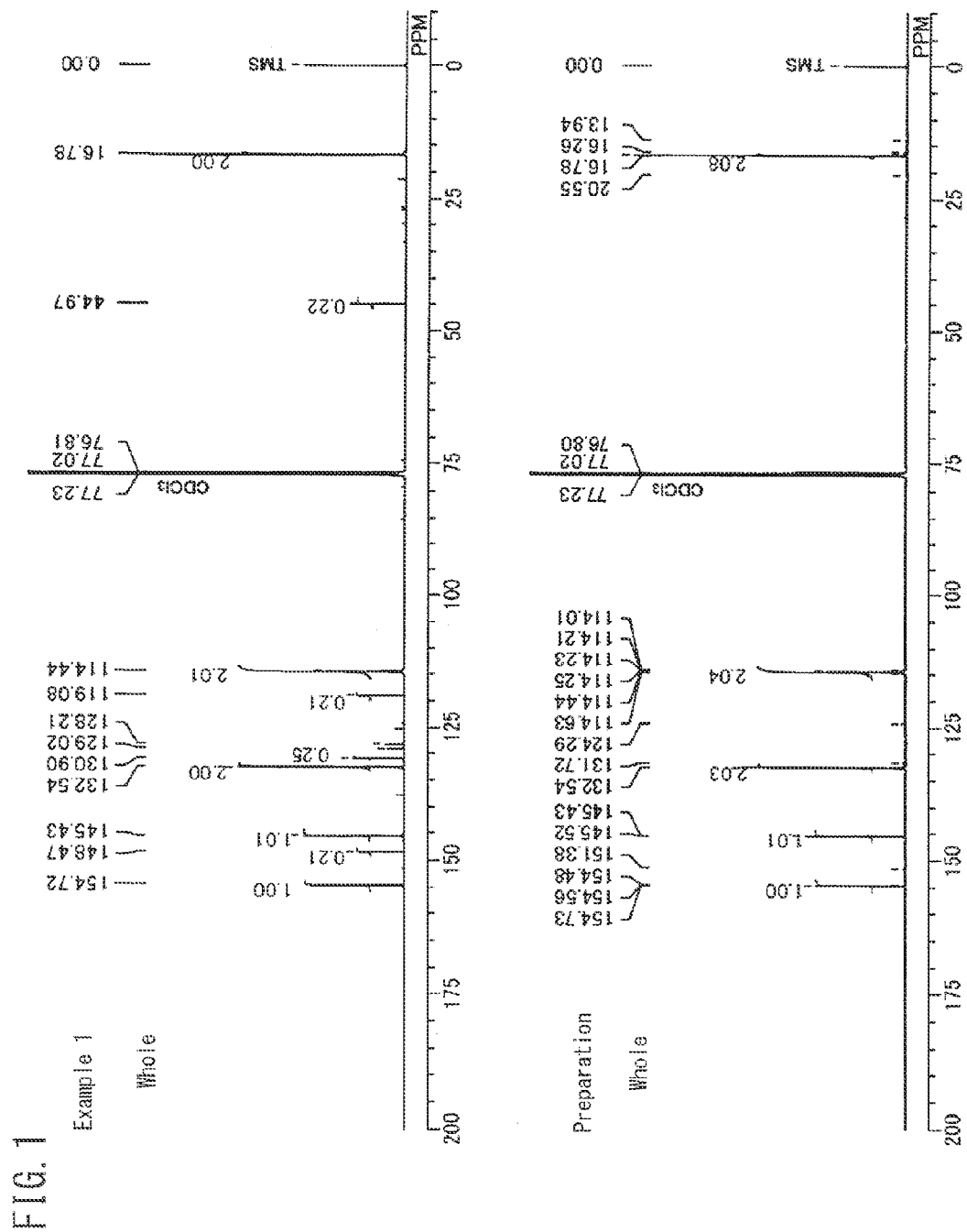
FIG. 1 shows a carbon nuclear magnetic resonance spectrum of an extract (A) obtained by the method of Example 1, and a carbon nuclear magnetic resonance spectrum of a standard substance.

FIG. 1 shows a carbon nuclear magnetic resonance spectrum for an extract (A) obtained by the method of Example 1, and a carbon nuclear magnetic resonance spectrum of a standard substance, for reference. First, the sum of the ratios between the signal strengths of 16.8, 114.4, 132.5, 145.4 and 154.7 ppm derived from PPE with respect to the signal strength for tetramethylsilane, based on the NMR spectrum for the standard substance, was used as the signal strength value (X1) for the standard substance. Next, the sum of the ratios of each of the signal strengths of 16.8, 114.4, 132.5, 145.4 and 154.7 ppm at the same signal positions as for the standard substance with respect to the signal strength for tetramethylsilane in the NMR spectrum of Example 1 was used as the signal strength value (X2) for Example 1. Using the values for X1 and X2, the PPE content ratio in the PPE particles (A) was calculated by the following formula:

PPE content ratio in PPE particles=(X2/X1)× 100=95%

[Mass of PPE Particles (A) in Prepreg]

The mass of the extract (A) was measured and recorded as the mass of PPE particles (A) in 2.5 g of prepreg.

[Mass of Dissolved PPE (B) in Prepreg]

All of the supernatant liquids obtained during measurement of the PPE content ratio of the PPE particles (A) by the procedure described above are recovered. The solvent of the supernatant liquid is removed by drying, and the mass of curable resin composition that is soluble in the solvent is measured. Next, the PPE content ratio in the curable resin composition that is soluble in the solvent is determined by quantitation by nuclear magnetic resonance spectroscopy in the same manner as for measurement of the PPE content ratio of the PPE particles (A). The mass of the dissolved PPE (B) in 2.5 g of prepreg was determined from the mass of the curable resin composition that was soluble in the solvent and the PPE content ratio of the curable resin composition that was soluble in the solvent, obtained by the method described above.

The mass ratio of (A) and (B) was determined from the mass of the PPE particles (A) and the mass of soluble PPE (B) in 2.5 g of prepreg, obtained by the method described above.

(2) Number-Average Molecular Weight of PPE in PPE Particles (A) and Number-Average Molecular Weight of Dissolved PPE (B).

[Number-Average Molecular Weight of PPE in PPE Particles (A)]

The aforementioned extract (A) is used as the measuring sample. Gel permeation chromatography (GPC) was performed using Shodex LF-804x2 (product of Showa Denko K.K.) as the column, 50° C. chloroform as the eluent and an RI (refractometer) as the detector, and the value measured based on standard polystyrene was recorded as the number-average molecular weight of PPE in the PPE particles (A), from the relational expression between the molecular weight of the standard polystyrene sample and the elution time, measured under the same conditions as above.

[Number-Average Molecular Weight of Dissolved PPE (B)]

The procedure of extracting PPE from the prepreg was carried out by the same method as for measurement of the PPE content ratio of the PPE particles (A) described above, and all of the supernatant liquids were recovered. The supernatant liquids were separated using silica gel column chromatography, to obtain a separated PPE solution. Next, the molecular weight of the PPE in the separated PPE solution was determined by measurement in the same manner as for the number-average molecular weight of the PPE component in the PPE particles (A).

(3) Measurement of Proportion of Particles with Specific Particle Sizes Among Total Number of PPE Particles (A) or Primary Particles (A'), and Measurement of Maximum Diameters To 2.5 g of prepreg there is added 20 g of a toluene/methanol mixed solvent at a mass ratio of 95:5, at 23° C.±2° C. One hour is allowed to pass in a thermostatic chamber at 23° C.±2° C. while vigorously shaking every 5 minutes. The mixture is then allowed to stand for 24 hours in the same thermostatic chamber. Next, the supernatant liquid is removed, 5 g of a toluene/methanol mixed solvent with a mass ratio of 95:5 is added and the mixture is again vigorously shaken, and it is then allowed to stand for 24 hours in the same thermostatic chamber. Next, the supernatant liquid is removed, and 5 g of a toluene/methanol mixed solvent with a mass ratio of 95:5 is added. After shaking to a uniform dispersion, the dispersion is removed and added dropwise to a sample stage for SEM-EDX measurement. After volatilizing off the solvent, SEM-EDX observation is conducted, particles with a carbon, oxygen and hydrogen total of 95% or greater are considered to be PPE particles, and the long diameters of the PPE particles (A) and the long diameters of the primary particles (A') are measured. A straight line is drawn running through the particle interior, and the length where the straight line is longest is recorded as the long diameter of the particle. For measurement of the long diameters of the PPE particles (A), the long diameters of 400 or more PPE particles are randomly measured. For measurement of the long diameters of the primary particles (A'), the long diameters of 400 or more PPE primary particles are randomly measured.

The number of PPE particles with a specific particle size are determined, and the proportion is calculated with respect to the total number of measured particles, and recorded as the proportion of particles with the specific particle size among the total number of PPE particles. The maximum long diameter is the maximum value of the long diameter among those measured.

(4) Powder Fall-Off and Peeling (180°, 90°) of Prepreg

Resin dust fall-off or resin detachment upon folding the prepreg 180° was examined and evaluated. First, the prepreg was cut to a size of 200 mm P 300 mm using a cutter blade. Next, the prepreg was folded 180° with the two rectangular long sides against each other, and then restored. The prepreg was then folded 180° with the two rectangular short sides against each other, and then restored. Samples without problems such as resin dust fall-off or resin layer peeling in the prepreg handling procedure described above were evaluated as "Good" (G). Samples that had severe resin dust fall-off were evaluated as "Poor (P)"/resin dust fall-off", and samples with notable peeling of the resin layer were evaluated as "Poor (P)/resin peeling".

A 90° test is the test conducted at 90° instead of 180°. The evaluation method is the same as described above.

(5) Average Number of Phenolic Hydroxyl Groups Per PPE Molecule

The number of phenolic hydroxyl groups in the PPE determined from the absorbance, and the number of PPE molecules determined from the average molecular weight, were used to determine the average number of phenolic hydroxyl groups per molecule.

First, the number of hydroxyl groups was determined from the value obtained by measuring the change in absorbance at a wavelength of 318 nm, for a sample obtained by adding a tetramethylammonium hydroxide solution to a methylene chloride solution of the PPE, using an ultraviolet and visible absorptiometer, by the method described in Japanese Journal of Polymer Science and Technology, vol. 51, No. 7 (1994), p. 480.

Separately, the number-average molecular weight of the PPE was determined by gel permeation chromatography (GPC), and this value was used to determine the number of PPE molecules. From this value, the average number of hydroxyl groups per PPE molecule was calculated by the following formula.

Average number of phenolic hydroxyl groups per PPE molecule=number of hydroxyl groups/ number-average molecular weight (6) Permittivity and Dielectric Loss Tangent (10 GHz, 1 GHz) of Laminated Sheet A laminated sheet was fabricated by stacking and vacuum pressing eight prepregs under conditions with a pressure of 5 kg/cm² while heating from room temperature at a temperature-elevating rate of 3° C./rain, and then when a temperature of 130° C. was reached, vacuum pressing under conditions with a pressure of 30 kg/cm² while heating at a temperature-elevating rate of 3° C./rain, and when a temperature of 200° C. was reached, vacuum pressing under conditions with a pressure of 30 kg/cm² and a time of 60 minutes while maintaining the temperature of 200° C. The laminated sheet was cut to a size of 50 mm P 1.8 mm, as a measuring sample for permittivity and dielectric loss tangent.

The permittivity and dielectric loss tangent of the laminated sheet at 10 GHz were measured under two conditions: steady state and moisture absorption, by the cavity resonance method using a network analyzer.

The measuring apparatuses used were a network analyzer (N5230A, Agilent Technologies) and a cavity resonator by Kantoh Electronics Application and Development Inc. (Cavity Resonator S Series).

Measurement in the steady state was conducted in an environment at 23° C. and a relative humidity of 65±5%, after placing the measuring sample in an oven at 105° C.±2° C. and drying for 2 hours, and then leaving it in an environment at 23° C. and a relative humidity of 65±5% for 96±5 hours.

Also, measurement in the moisture absorption state was conducted in an environment at 23° C. and a relative humidity of 65±5%, after placing the measuring sample in an oven at 105° C. and drying for 2 hours, and then immersing it in water at 23° C. for 96±5 hours and wiping off the water on the sample surface.

The permittivity and dielectric loss tangent of the laminated sheet at 1 GHz was measured using an impedance analyzer. The measuring apparatus used was an impedance analyzer (4291B op. 002 with 16453A, 16454A, Agilent Technologies), and measurement was conducted with a test strip thickness of approximately 2 mm, a voltage of 100 mV and a frequency of 1 MHz-1.8 GHz, determining the average value for 100 sweeps.

(7) Absorption Percentage of Laminated Sheet (Mass %)

A double-sided copper-clad laminate was obtained, by stacking two prepregs, layering copper foils (thickness: 12 μm, GTS-MP foils, products of Furukawa Electric Co., Ltd.) above and below them, vacuum pressing under conditions with a pressure of 5 kg/cm² while heating from room temperature at a temperature-elevating rate of 3° C./rain, and then when a temperature of 130° C. was reached, vacuum pressing under conditions with a pressure of 30 kg/cm² while heating at a temperature-elevating rate of 3° C./min, and when a temperature of 200° C. was reached, vacuum pressing under conditions with a pressure of 30 kg/cm² and a time of 60 minutes while maintaining the temperature of 200° C. Next, the copper foil was removed by etching to obtain a measuring sample.

The measuring sample was supplied for a moisture absorption acceleration test, and the absorption percentage was determined from the increased mass.

The measuring sample was cut to 50 mm square to prepare a test strip. After drying the test strip at 130° C. for 30 minutes, the mass was measured and recorded as the mass (g) before the acceleration test. The mass was then measured after an acceleration test under conditions with a temperature of 121° C., a pressure of 2 atm and a time of 4 hours, and was recorded as the mass (g) after the acceleration test.

The mass (g) before the acceleration test and the mass (g) after the acceleration test were used to calculate the absorption percentage by the following formula, and the mean value for the measured values of 4 test strips was determined.

Absorption percentage (mass %)=(Mass before acceleration test−mass after acceleration test)/ mass before acceleration test×100

(8) Soldering Heat Resistance of Laminated Sheet after Moisture Absorption Test

The measuring sample was used after measurement of the absorption percentage described in (7) above, for a solder heat resistance test at 288° C. and 260° C. The laminated sheet after the moisture absorption acceleration test was immersed in a solder bath at 288° C. or 260° C. for 20 seconds, and visually observed. Laminated sheets that were not found to have blistering, detachment or whitening even when immersed in a solder bath at 288° C. were evaluated as "solder heat-proof 288° C.". In addition, laminated sheets that exhibited one or more from among blistering, detachment and whitening after immersion in a solder bath at 288° C. but were not found to have blistering, detachment or whitening even when immersed in a solder bath at 260° C., were evaluated as "solder heat-proof 260° C.". Also, laminated sheets that exhibited one or more from among blistering, detachment and whitening after immersion in a solder bath at 260° C. were evaluated as "poor".

(9) Copper Foil Peel Strength of Laminated Sheet (Peel Strength N/mm)

A double-sided copper-clad laminate was fabricated, by stacking two prepregs, layering copper foils (thickness: 35 μm, GTS-MP foils, products of Furukawa Electric Co., Ltd. (evaluation results in Table 1), or thickness: 12 μm, surface roughness Rz: 2.0 μm, FV-WS foil, products of Furukawa Electric Co., Ltd. (evaluation results in Table 2)) above and below them, vacuum pressing under conditions with a pressure of 5 kg/cm$^2$ while heating from room temperature at a temperature-elevating rate of 3° C./rain, and then when a temperature of 130° C. was reached, vacuum pressing under conditions with a pressure of 30 kg/cm$^2$ while heating at a temperature-elevating rate of 3° C./min, and when a temperature of 200° C. was reached, vacuum pressing under conditions with a pressure of 30 kg/cm$^2$ and a time of 60 minutes while maintaining the temperature of 200° C. The double-sided copper-clad laminate was used as a sample for measurement.

This was based on standard JIS C 6481 for a printed circuit board copper-clad laminate test. The measuring sample was cut out to a size of 15 mm width P 150 mm length, an autograph (AG-5000D, product of Shimadzu Corp.) was used to measure the mean value of the load when peeling off the copper foil at an angle of 90° C. with respect to the removal plane at a speed of 50 mm/min, and the mean value for five measurements was calculated.

(10) Peel Strength (Release Strength) Between Laminated Sheet Base Material and Low-Dielectric Resin The stress was measured when peeling off one layer of a base material with two or more layers composing the laminated sheet at a constant speed. The double-sided copper-clad laminate fabricated for measurement of the copper foil peel strength of the laminated sheet in (9) (copper foil: 12 μm thickness, surface roughness Rz=2.0 μm, FV-WS foil, product of Furukawa Electric Co., Ltd.) was used as the measuring sample, the laminated sheet was cut out to a size of 15 mm width P 150 mm length, an autograph (AG-5000D, product of Shimadzu Corp.) was used to measure the mean value of the load when peeling off one layer of the base material at an angle of 90° with respect to the removal plane at a speed of 50 mm/min, and the mean value for five measurements was calculated.

(11) Coefficient of Linear Thermal Expansion of Laminated Sheet (CTE (Ppm/K))

This is the value determined by TMA (Thermo-mechanical analysis), at a temperature of ≤Tg.

The test strip is prepared by removing the metal foil on the surface layer by etching and then cutting to 5 mm square. A load of 40 g/cm$^2$ is exerted on the test strip, heating is effected at a temperature-elevating rate of 10° C./min, and the change in thickness of the test strip is measured. It is then heated from 25° C. to 300° C. The degree of change in thickness in the temperature range of 50° C. to 100° C. was divided by the thickness of the test strip, and this value further divided by 50 was recorded as the coefficient of linear thermal expansion.

(12) Glass Transition Temperature of Cured Product

The dynamic viscoelasticity of the cured test strip was measured and the temperature of maximum tan δ was determined.

A dynamic viscoelasticity meter (RHEOVIBRON Model DDV-01FP, by Orientec) was used as the measuring apparatus for measurement under the following conditions: test strip: approximately 35 mm length, approximately 12.5 mm width and approximately 0.3 mm thickness, tensile mode, frequency: 10 rad/s.

The test strip was prepared by stacking two prepregs, layering 12 μm-thick copper foils (GTS-MP foils, products of Furukawa Electric Co., Ltd.) above and below them, vacuum pressing under conditions with a final ultimate temperature of 200° C. and a final ultimate pressure of 30 kg/cm$^2$, to obtain a double-sided copper-clad laminate, and then removing the copper foil by etching.

(13) Heat Resistance Test

Eight prepregs were stacked, and copper foils with thicknesses of 12 μm and surface roughnesses Rz of 2.0 μm (FV-WS foils, products of Furukawa Electric Co., Ltd.) were layered on both sides. A copper-clad laminate was then fabricated by vacuum pressing under conditions with a pressure of 5 kg/cm$^2$ while heating from room temperature at a temperature-elevating rate of 3° C./min, and then when a temperature of 130° C. was reached, vacuum pressing under conditions with a pressure of 30 kg/cm$^2$ while heating at a temperature-elevating rate of 3° C./min, and when a temperature of 200° C. was reached, vacuum pressing under conditions with a pressure of 30 kg/cm$^2$ and a time of 60 minutes while maintaining the temperature of 200° C. One of the copper foils was removed by etching, and a heat resistance test was conducted.

The heat resistance test was conducted by a pressure cooker test under conditions of 2 atmospheres, 4 hours, after cutting out the test strip to 50 mm square, placing it in an oven at 105° C. and drying for 2 hours. Next, a test of dipping for 20 seconds in a solder bath at 288° C. was repeated 30 times as a heat resistance test. The dipping interval was 20 seconds. A cross-section of the sample after heat resistance testing was observed by SEM.

Production Example 1

Low Molecular Weight Polyphenylene Ether (Mn 3,000)

A 10 L flask was set in an oil bath that had been heated to 90° C., and nitrogen gas was introduced into the flask at 30 ml/min. The procedure was subsequently carried out under a nitrogen gas stream. After then adding 1000 g of PPE and 3000 g of toluene, the mixture was stirred to dissolution. A solution of 80 g of bisphenol A dissolved in 350 g of methanol was then added to the flask while stirring. After continuing to stir for 5 minutes, 3 ml of a mineral spirit solution containing 6 mass % cobalt naphthenate was added through an injector and stirring was continued for 5 minutes. Next, 1125 g of toluene was added to 375 g of a benzoyl peroxide solution, and the solution diluted to a benzoyl peroxide concentration of 10 mass % was placed in a dropping funnel and added dropwise to the flask over a period of 2 hours. Upon completion of the dropwise addition, heating and stirring were continued for another 2 hours to obtain a reaction mixture containing low molecular weight PPE. A large amount of methanol was added thereto to precipitate the low molecular weight PPE, and after filtration it was dried to obtain the low molecular weight PPE. The number-average molecular weight of the obtained low molecular weight PPE was 3,000, and the average number of phenolic hydroxyl groups per molecule was 1.88.

Production Example 2

Low Molecular Weight/Terminal Benzylated Polyphenylene Ether (Mn 2,400)

A 10 L flask was set in an oil bath that had been heated to 90° C., and nitrogen gas was introduced into the flask at 30 ml/min. The procedure was subsequently carried out under a nitrogen gas stream. After then adding 1000 g of PPE and 3000 g of toluene, the mixture was stirred to dissolution. A solution of 80 g of bisphenol A dissolved in 350 g of methanol was then added to the flask while stirring. After continuing to stir for 5 minutes, 3 ml of a mineral spirit solution containing 6 mass % cobalt naphthenate was added through an injector and stirring was continued for 5 minutes. Next, 1125 g of toluene was added to 375 g of a benzoyl peroxide solution, and the solution diluted to a benzoyl peroxide concentration of 10 mass % was placed in a dropping funnel and added dropwise to the flask over a period of 2 hours. Upon completion of the dropwise addition, heating and stirring were continued for another 2 hours to obtain a reaction mixture containing low molecular weight PPE. The number-average molecular weight of the obtained low molecular weight PPE was 2,800, and the average number of phenolic hydroxyl groups per molecule was 1.96.

Next, the temperature of the reaction mixture containing the low molecular weight PPE was lowered to 50° C., an aqueous solution of 340 g of sodium hydroxide dissolved in 3050 g of ion-exchanged water, and 31 g of tetrabutylammonium iodide were added, and the mixture was stirred for 5 minutes. Next, 1070 g of benzyl chloride was added and the mixture was stirred at a temperature of 50° C. for 4 hours to obtain a reaction mixture containing low molecular weight/benzylated PPE. The reaction mixture was allowed to stand for separation into two layers, and the lower layer was removed. Water (1000 g) was further added, and after stirring and standing whereby it again separated into two layers, the lower layer was removed. Next, 200 g of methanol was added, the mixture was stirred and allowed to stand in the same manner for separation into two layers, and the upper layer was removed. There was further added 100 g of methanol, the mixture was stirred and allowed to stand in the same manner for separation into two layers, and then the lower layer was recovered to obtain a reaction mixture containing low molecular weight/benzylated. PPE. A large amount of methanol was added thereto to precipitate the low molecular weight/benzylated PPE, and after filtration it was dried to obtain the low molecular weight/benzylated PPE. The number-average molecular weight of the obtained low molecular weight/benzylated PPE was 3,000, and the average number of phenolic hydroxyl groups per molecule was 0.01.

Production Example 3:

Low Molecular Weight/Terminal Allylated Polyphenylene Ether (Mn 2,600)

Allyl glycidyl ether "NeoallylG" (trademark of Daiso Corp.) (1000 g) was heated to 100° C. and stirred. After thorough mixing, 0.05 g of NaOCH$_3$ was added as a catalyst and the mixture was stirred for approximately 15 minutes. It was then heated to 165° C., and a low molecular weight PPE solution obtained by the same method as Production Example 1 was added over a period of 90 minutes. During this time, the toluene solvent was removed from the reaction system at ordinary pressure or under reduced pressure by streaming nitrogen into the reactor.

The mixture was then stirred at 165° C. for 5 hours and subsequently heated to 180° C., and the unreacted allyl glycidyl ether was removed under reduced pressure to obtain an allylated PPE resin. The number-average molecular weight of the obtained resin was 2900, and the average number of phenolic hydroxyl groups per molecule was 0.03.

Production Example 4

Low Molecular Weight/Terminal Partially Allylated Polyphenylene Ether (Mn 2,600)

Allyl glycidyl ether "NeoallylG" (trademark of Daiso Corp.) (1000 g) was heated to 100° C. and stirred. After thorough mixing, 0.03 g of NaOCH$_3$ was added as a catalyst and the mixture was stirred for approximately 15 minutes. It was then heated to 165° C., and a low molecular weight PPE solution obtained by the same method as Production Example 1 was added over a period of 90 minutes. During this time, the toluene solvent was removed from the reaction system at ordinary pressure or under reduced pressure by streaming nitrogen into the reactor.

The mixture was then stirred at 165° C. for 5 hours and then heated to 180° C., and the unreacted allyl glycidyl ether was removed under reduced pressure to obtain an allylated PPE resin. The number-average molecular weight of the obtained resin was 2900, and the average number of phenolic hydroxyl groups per molecule was 0.43.

Production Example 5

Partially Maleated Polyphenylene Ether (Mn 18,000)

After dry blending 100 parts by weight of PPE (S202A, product of Asahi Kasei Chemicals Corp., number-average molecular weight: 18,000, average number of phenolic hydroxyl groups per molecule: 1.84), 1.5 parts by weight of maleic anhydride and 1.0 part by weight of 2,5-dimethyl-2, 5-di(t-butylperoxy)hexane (PERHEXA 25B, product of NOF Corp.) at room temperature, it was extruded with a twin-screw extruder under conditions with a cylinder temperature of 300° C. and a screw rotational speed of 230 rpm, to obtain a reaction product of PPE and maleic anhydride. The number-average molecular weight of the obtained reaction product of PPE and maleic anhydride was 17,000, and the average number of phenolic hydroxyl groups per molecule was 0.95.

Example 1

After placing 147 parts by weight of a toluene/methanol mixed solvent (mass ratio: 95:5) in a stainless steel beaker, 32.3 parts of PPE1 and 3.6 parts by weight of a styrene-based elastomer were added while stirring, and stirring was continued for 2 hours. Next, a homomixer (Model HM-300 by As One Corp.) was used for shredding of the PPE under conditions of 25° C., 8,000 rpm for 30 minutes, to obtain a dispersion of PPE particles.

Next, 21.3 parts by weight of triallyl isocyanurate and 2.3 parts by weight of α,α'-bis(t-butylperoxy-m-isopropyl)benzene were added to the obtained PPE dispersion and the mixture was uniformly stirred, after which 15.9 parts of decabromodiphenylethane and 24.6 parts by weight of silica were added and the mixture was uniformly stirred to obtain a coating varnish.

The obtained varnish was then impregnated into an E glass cloth with a thickness of about 0.1 mm (2116 STYLE, product of Asahi-Schwebel Co., Ltd.), and after wiping off the excess varnish with a slit, the solvent was removed by drying to obtain a prepreg A with a resin content of 60 mass %.

Example 2

After placing 210 parts by weight of a toluene/methanol mixed solvent (mass ratio: 95:5) in a stainless steel beaker, PPE1 and polystyrene were added in the amounts listed in Table 1 while stirring, and the stirring was continued for 2 hours. Next, a homomixer (Model HM-300 by As One Corp.) was used for shredding of the PPE under conditions of 25° C., 8,000 rpm for 30 minutes, to obtain a dispersion of PPE particles.

The other curable resin composition components were then added to the obtained PPE dispersion with the formulation listed in Table 1, and the mixture was uniformly stirred to obtain a coating varnish.

The obtained varnish was then impregnated into an E glass cloth with a thickness of about 0.1 mm (2116 STYLE, product of Asahi-Schwebel Co., Ltd.), and after wiping off the excess varnish with a slit, the solvent was removed by drying to obtain a prepreg B with a resin content of 60 mass %.

Example 3

Prepreg C with a resin content of 60 mass % was obtained by the same method as Example 2, except that the amount of toluene was 158 parts by weight.

Examples 4 to 7

Prepregs D to G with resin contents of 60 mass % were obtained by the same method as Example 2, except for using the formulations listed in Table 1.

Example 8

PPE1 in a methanol solvent was shredded using a homomixer (Model HM-300 by As One Corp.) under conditions of 25° C., 8,000 rpm for 4 hours, the methanol solvent was subsequently removed by drying, and then PPE powder was recovered by screening through a JIS test sieve with an aperture of 12 μm.

After placing 210 parts by weight of toluene and 2.6 parts by weight of polystyrene in a separable flask, they were stirred at 25° C. to dissolve the polystyrene. Next, 53.3 parts of previously prepared PPE powder was added and the mixture was stirred at 25° C. for 2 hours to obtain a dispersion of PPE particles. The obtained PPE dispersion was used to obtain prepreg H with a resin content of 60 mass %, by the same method as Example 2.

Example 9

Prepreg I with a resin content of 60 mass % was obtained by the same method as Example 8, except that the aperture of the JIS test sieve was changed to 20 μm.

Example 10

Prepreg J with a resin content of 60 mass % was obtained by the same method as Example 8, except that the aperture of the JIS test sieve was changed to 26 μm.

Example 11

After placing 158 parts by weight of toluene in a separable flask, it was heated to 80° C. After then adding 53.3 parts of PPE1 and 1.5 parts by weight of polystyrene, the mixture was stirred at 80° C. for 2 hours to dissolve the PPE and polystyrene. Stirring was halted, and the temperature was lowered to 25° C. over a period of 5 hours to obtain a dispersion of PPE particles. When the dispersion was observed under an optical microscope, approximately 4 to 12 μm PPE crystalline particles were found to be dispersed.

After adding 22.8 parts by weight of triallyl isocyanurate and 1.5 parts by weight of α,α'-bis(t-butylperoxy-m-isopropyl)benzene to the obtained PPE dispersion and uniformly stirring, 19.8 parts of decabromodiphenylethane was added and the mixture was uniformly stirred to obtain a coating varnish.

The obtained varnish was then impregnated into an E glass cloth with a thickness of about 0.1 mm (2116 STYLE, product of Asahi-Schwebel Co., Ltd.), and after wiping off the excess varnish with a slit, the solvent was removed by drying to obtain a prepreg K with a resin content of 60 mass %.

The proportion (particle number %) of primary particles with particle sizes of between 3 μm and 20 μm in the prepreg was 68%.

Example 12

Prepreg L with a resin content of 60 mass % was obtained by the same method as Example 11, except that the temperature lowering of the toluene solution of PPE and polystyrene was to 35° C.

The proportion (particle number %) of primary particles with particle sizes of between 3 μm and 20 μm in the prepreg was 92%.

Example 13

Prepreg M with a resin content of 60 mass % was obtained by the same method as Example 11, except that the amount of toluene was 210 parts by weight, and the temperature lowering of the toluene solution of PPE and polystyrene was to 20° C.

The proportion (particle number %) of primary particles with particle sizes of between 3 μm and 20 μm in the prepreg was 81%.

Example 14

Prepreg N with a resin content of 60 mass % was obtained by the same method as Example 13, except that the temperature lowering of the toluene solution of PPE and polystyrene was to 35° C.

The proportion (particle number %) of primary particles with particle sizes of between 3 μm and 20 μm in the prepreg was 88%.

Example 15

After placing 147 parts by weight of a toluene/methanol mixed solvent (mass ratio: 95:5) in a stainless steel beaker, 32.3 parts of PPE1 and 3.6 parts by weight of a styrene-based elastomer were added while stirring, and stirring was continued for 2 hours. Next, a homomixer (Model HM-300 by As One Corp.) was used for shredding of the PPE under conditions of 25° C., 8,000 rpm for 30 minutes, to obtain a dispersion of PPE particles.

Next, 21.3 parts by weight of triallyl isocyanurate and 2.3 parts by weight of α,α'-bis(t-butylperoxy-m-isopropyl)benzene were added to the obtained PPE dispersion and the mixture was uniformly stirred, after which 15.9 parts of decabromodiphenylethane and 24.6 parts by weight of silica were added and the mixture was uniformly stirred to obtain a coating varnish.

The obtained varnish was then impregnated into an E glass cloth with a thickness of about 0.1 mm (2116 STYLE, product of Asahi-Schwebel Co., Ltd.), and after wiping off the excess varnish with a slit, the solvent was removed by drying to obtain a prepreg O with a resin content of 60 mass %.

Example 16

PPE1 was mashed with a mortar and then screened using a JIS test sieve with an aperture of 38 μm, and the screened portions were recovered to obtain PPE powder.

After placing 210 parts by weight of toluene and 2.6 parts by weight of polystyrene (650, by PS Japan Corp.) in a separable flask, they were stirred at 25° C. to dissolve the polystyrene. Next, 53.3 parts of previously prepared PPE powder was added and the mixture was stirred at 25° C. for 2 hours to obtain a dispersion of PPE particles. When the dispersion was observed under an optical microscope, PPE particles with long diameters of approximately 2 μm to 40 μm were found to be dispersed. The obtained PPE dispersion was used to obtain prepreg P with a resin content of 60 mass %, by the same method as Example 2.

Comparative Example 1

After placing 158 parts by weight of toluene in a separable flask, it was heated to 80° C. After then adding 53.3 parts of PPE1 and 2.6 parts by weight of polystyrene, the mixture was stirred for 2 hours to dissolution. After then adding 22.8 parts by weight of triallyl isocyanurate and 1.5 parts by weight of α,α'-bis(t-butylperoxy-m-isopropyl)benzene and uniformly stirring, 19.8 parts of decabromodiphenylethane was added and the mixture was uniformly stirred to obtain a coating varnish.

The temperature of the obtained varnish was then lowered to 60° C. while stirring, and impregnated into an E glass cloth with a thickness of about 0.1 mm (2116 STYLE, product of Asahi-Schwebel Co., Ltd.) under conditions maintaining the varnish at 60° C., and after wiping off the excess varnish with a slit, the solvent was removed by drying to obtain a prepreg Q with a resin content of 60 mass %.

Comparative Examples 2, 3 and 5

Prepregs R, S and U with resin contents of 60 mass % were obtained by the same method as Example 2, except for using the formulations listed in Table 1.

Comparative Example 4

After placing 280 parts by weight of toluene in a separable flask, it was heated to 80° C. After adding 53.3 parts of PPE1, 2.6 parts by weight of polystyrene and 22.8 parts by weight of triallyl isocyanurate, the mixture was stirred at 80° C. for 2 hours to dissolution. Stirring was halted, and the temperature was lowered to 25° C. over a period of 5 hours to obtain a dispersion of PPE particles. When the dispersion was observed under an optical microscope, approximately 0.2 to 8 μm PPE crystalline particles were found to be dispersed.

After adding 1.5 parts by weight of α,α'-bis(t-butylperoxy-m-isopropyl)benzene to the obtained PPE dispersion and uniformly stirring, 19.8 parts of decabromodiphenylethane was added and the mixture was uniformly stirred to obtain a coating varnish.

The obtained varnish was then impregnated into an E glass cloth with a thickness of about 0.1 mm (2116 STYLE, product of Asahi-Schwebel Co., Ltd.), and after wiping off the excess varnish with a slit, the solvent was removed by drying to obtain a prepreg T with a resin content of 60 mass %.

Test Example 1

Each of the prepregs A to U obtained in the examples and comparative examples were evaluated. The results are shown in the table.

TABLE 1

| | | Example 1 | Example 2 | Example 3 | Example 4 | Example 5 | Example 6 | Example 7 | Example 8 | Example 9 | Example 10 | Example 11 |
|---|---|---|---|---|---|---|---|---|---|---|---|---|
| Curable resin composition | Polyphenylene ether 1 | 32.3 | 53.3 | 53.3 | | | | | 53.3 | 53.3 | 53.3 | 53.3 |
| | Polyphenylene ether 2 | | | | 53.3 | | | | | | | |
| | Polyphenylene ether 3 | | | | | 53.3 | | | | | | |
| | Partial maleated polyphenylene ether (Mn 18,000) | | | | | | 53.3 | | | | | |
| | Low molecular weight terminal benzylated polyphenylene ether (Mn 2,400) | 21.3 | | | | | | 42.6 | | | | |
| | Low molecular weight terminal allylated polyphenylene ether (Mn 2,600) | 3.6 | | | | | | 10.7 | | | | |
| | Low molecular weight terminal partially allylated polyphenylene ether (Mn 2,600) | 24.6 | | | | | | | | | | |
| | Low molecular weight polyphenylene ether (Mn 3,000) | | | | | | | | | | | |
| | Triallylisocyanurate | 15.9 | 22.8 | 22.8 | 22.8 | 22.8 | 22.8 | 22.8 | 22.8 | 22.8 | 22.8 | 22.8 |
| | Polystyrene | 2.3 | 2.6 | 2.6 | 2.6 | 2.6 | 2.6 | 2.6 | 2.6 | 2.6 | 2.6 | 2.6 |
| | Styrene-based elastomer | | | | | | | | | | | |
| | Silica | | | | | | | | | | | |
| | Decabromodiphenylethane | 19.8 | 19.8 | 19.8 | 19.8 | 19.8 | 19.8 | 19.8 | 19.8 | 19.8 | 19.8 | 19.8 |
| | α,α'-bis(t-Butylperoxy-m-isopropyl)benzene | 1.5 | 1.5 | 1.5 | 1.5 | 1.5 | 1.5 | 1.5 | 1.5 | 1.5 | 1.5 | 1.5 |
| Extraction by specific solvent | Insoluble (A) Polyphenylene ether content (wt %) | 95 | 93 | 92 | 96 | 89 | 92 | 90 | 88 | 93 | 94 | 87 |
| | Number-average mol. wt. | 18,000 | 18,000 | 18,000 | 25,000 | 10,000 | 18,000 | 17,000 | 18,000 | 18,000 | 18,000 | 18,000 |
| | Percentage of particles with sizes: 0.3-200 μm (particle %) | 99 | 99 | 99 | 99 | 99 | 99 | 99 | 99 | 99 | 99 | 100 |
| | Percentage of particles with sizes: 1-100 μm (particle %) | 99 | 100 | 99 | 99 | 99 | 99 | 99 | 99 | 99 | 66 | 100 |
| | Percentage of primary particles with sizes: 0.3-30 μm (particle %) | 99 | 99 | 99 | 99 | 99 | 99 | 99 | 99 | 99 | 98 | 100 |
| | Percentage of primary particles with sizes: 0.3-20 μm (particle %) | 98 | 88 | 98 | 98 | 97 | 96 | 98 | 98 | 94 | 88 | 99 |
| | Percentage of primary particles with sizes: 0.3-3 μm (particle %) | 86 | 88 | 66 | 90 | 89 | 70 | 90 | 89 | 82 | 88 | 29 |
| | Maximum size (μm) | 5 | 6 | 7 | 6 | 5 | 7 | 5 | 8 | 12 | 18 | 12 |
| Soluble (B) | Average mol. wt. | 18,000 | 17,000 | 18,000 | 23,000 | 10,000 | 14,000 | 17,000 | 18,000 | 18,000 | 18,000 | 18,000 |
| (A) and (B) mass ratio | | 88:12 | 88:12 | 92:8 | 92:8 | 87:13 | 69:31 | 72:28 | 88:12 | 90:10 | 92:8 | 74:26 |
| Prepreg name | | A | B | C | D | E | F | G | H | I | J | K |

TABLE 1-continued

| Property | | Example 11 | Example 12 | Example 13 | Example 14 | Example 15 | Example 16 | Comp. Ex. 1 | Comp. Ex. 2 | Comp. Ex. 3 | Comp. Ex. 4 | Comp. Ex. 5 |
|---|---|---|---|---|---|---|---|---|---|---|---|---|
| Permittivity [10 GHz] | Steady state | 3.5 | 3.6 | 3.6 | 3.6 | 3.6 | 3.6 | 3.6 | 3.6 | 3.6 | 3.6 | 3.6 |
| | Moisture absorption state | 3.5 | 3.6 | 3.6 | 3.6 | 3.6 | 3.6 | 3.6 | 3.6 | 3.6 | 3.6 | 3.6 |
| Dielectric loss tangent [10 GHz] | Steady state | 0.0065 | 0.0050 | 0.0050 | 0.0045 | 0.0053 | 0.0048 | 0.0046 | 0.0050 | 0.0050 | 0.0051 | 0.0050 |
| | Moisture absorption state | 0.0077 | 0.0059 | 0.0059 | 0.0053 | 0.0061 | 0.0058 | 0.0055 | 0.0060 | 0.0061 | 0.0062 | 0.0065 |
| Permittivity [1 GHz] | | 3.6 | 3.6 | 3.6 | 3.6 | 3.6 | 3.6 | 3.6 | 3.6 | 3.6 | 3.6 | 3.6 |
| Dielectric loss tangent [1 GHz] | | 0.003 | 0.002 | 0.002 | 0.002 | 0.002 | 0.002 | 0.002 | 0.002 | 0.002 | 0.002 | 0.002 |
| Prepreg powder fall-off and peeling (180°) | | G | G | G | G | G | G | G | G | G | G | G |
| Prepreg powder fall-off and peeling (90°) | | G | G | G | G | G | G | G | G | G | G | G |
| Absorption (wt %) | | 0.19 | 0.20 | 0.27 | 0.29 | 0.15 | 0.25 | 0.25 | 0.30 | 0.32 | 0.34 | 0.21 |
| Soldering heat resistance | | 288° C. | 288° C. | 288° C. | 288° C. | 288° C. | 288° C. | 288° C. | 288° C. | 288° C. | 288° C. | 288° C. |
| Copper foil peel strength (N/mm) | | 1.8 | 1.9 | 1.7 | 1.8 | 1.9 | 1.8 | 1.9 | 1.7 | 1.7 | 1.7 | 1.8 |

| | | Example 12 | Example 13 | Example 14 | Example 15 | Example 16 | Comp. Ex. 1 | Comp. Ex. 2 | Comp. Ex. 3 | Comp. Ex. 4 | Comp. Ex. 5 |
|---|---|---|---|---|---|---|---|---|---|---|---|
| Curable resin composition | Polyphenylene ether 1 | 53.3 | 53.3 | 53.3 | | 53.3 | 53.3 | | 53.3 | 53.3 | |
| | Polyphenylene ether 2 | | | | | | | | | | |
| | Polyphenylene ether 3 | | | | | | | | | | |
| | Partial maleated polyphenylene ether (Mn 18,000) | | | | 37.6 | | | | | | 53.3 |
| | Low molecular weight terminal benzylated polyphenylene ether (Mn 2,400) | | | | | | | 53.3 | | | |
| | Low molecular weight terminal allylated polyphenylene ether (Mn 2,600) | | | | | | | | 42.6 | | |
| | Low molecular weight terminal partially allylated polyphenylene ether (Mn 2,600) | | | | | | | | | | |
| | Low molecular weight polyphenylene ether (Mn 3,000) | | | | | | | | | | |
| | Triallylisocyanurate | 22.8 | 22.8 | 22.8 | 37.6 | 22.8 | 22.8 | 22.8 | 22.8 | 22.8 | 22.8 |
| | Polystyrene | 2.6 | 2.6 | 2.6 | 2.9 | 2.6 | 2.6 | 2.6 | 2.6 | 2.6 | 2.6 |
| | Styrene-based elastomer | 19.8 | 19.8 | 19.8 | 17.8 | 19.8 | 19.8 | 19.8 | 19.8 | 19.8 | 19.8 |
| | Silica | 1.5 | 1.5 | 1.5 | 4.1 | 1.5 | 1.5 | 1.5 | 1.5 | 1.5 | 1.5 |
| | Decabromodiphenylethane | | | | | | | | | | |
| | α,α'-bis(t-Butylperoxy-m-isopropyl)benzene | | | | | | | | | | |
| Extraction by specific solvent | Insoluble (A) Polyphenylene ether content (wt %) | 96 | 90 | 100 | 88 | 98 | | | | 60 | |
| | Number-average mol. wt. | 18,000 | 18,000 | 18,000 | 18,000 | 18,000 | | | | 18,000 | |
| | Percentage of particles with sizes: 0.3-200 µm (particle %) | 100 | 100 | 100 | | 82 | | | | 100 | |
| | Percentage of particles with sizes: 1-100 µm (particle %) | 100 | 100 | 100 | | 65 | | | | 100 | |

TABLE 1-continued

| | | | | | | | | | |
|---|---|---|---|---|---|---|---|---|---|
| Percentage of primary particles with sizes: 0.3-30 μm (particle %) | 100 | 100 | 100 | — | 97 | — | — | — | — |
| Percentage of primary particles with sizes: 0.3-20 μm (particle %) | 99 | 99 | 99 | — | 55 | — | — | — | 99 |
| Percentage of primary particles with sizes: 0.3-3 μm (particle %) | 7 | 18 | 12 | — | 11 | — | — | — | 35 |
| Maximum size (μm) | 12 | 13 | 12 | — | 36 | — | — | — | 12 |
| Soluble (B) Average mol. wt. | 16,000 | 17,000 | 16,000 | 18,000 | 18,000 | 18,000 | 2,500 | 2,700 | 17,000 |
| (A) and (B) mass ratio | 59:41 | 70:30 | 45:55 | 85:15 | 74:26 | 0:100 | 0:100 | 0:100 | 78:22 |
| Prepreg name | L | M | N | O | P | Q | R | S | T |
| Property Permittivity [10 GHz] Steady state | 3.6 | 3.6 | 3.6 | 3.6 | 3.6 | 3.6 | 3.6 | 3.6 | 3.6 |
| Moisture absorption state | 3.6 | 3.6 | 3.6 | 3.6 | 3.7 | 3.6 | 3.7 | 3.7 | 3.7 |
| Dielectric loss tangent [10 GHz] Steady state | 0.0051 | 0.0050 | 0.0072 | 0.0058 | 0.0052 | 0.0053 | 0.0054 | 0.0052 | |
| Moisture absorption state | 0.0066 | 0.0066 | 0.0085 | 0.0073 | 0.0072 | 0.0082 | 0.0082 | 0.0084 | |
| Permittivity [1 GHz] | 3.6 | 3.6 | | | 3.6 | | | | |
| Dielectric loss tangent [1 GHz] | 0.002 | 0.002 | | | 0.004 | | | | |
| Prepreg powder fall-off and peeling (180°) | G | G | G | G | P Powder fall-off | P Peeling | P Peeling | P Peeling | P Powder fall-off |
| Prepreg powder fall-off and peeling (90°) | G | G | G | G | G | P Peeling | P Peeling | P Peeling | P Powder fall-off |
| Absorption (wt %) | 0.27 | 0.20 | 0.31 | 0.33 | 0.46 | 0.35 | 0.45 | 0.48 | 0.43 |
| Soldering heat resistance | 288° C. | 288° C. | 288° C. | 288° C. | Unacceptable | 260° C. | 260° C. | 260° C. | Unacceptable |
| Copper foil peel strength (N/mm) | 1.8 | 1.8 | 1.7 | 1.7 | 0.8 | 1.6 | 1.5 | 1.5 | 1.1 |

| | |
|---|---|
| | |
| | |
| | |
| | 2,500 |
| | 0:100 |
| | U |
| | 3.6 |
| | 3.7 |
| | 0.0060 |
| | 0.0080 |
| | |
| | |
| | P Peeling |
| | P Peeling |
| | 0.41 |
| | 260° C. |
| | 1.0 |

Polyphenylene ether 1: S202A, Asahi Kasei Chemicals Corp., number-average mol. wt. 18,000, average no. phenolic hydroxyl groups per molecule: 1.84
Polyphenylene ether 2: S201A, Asahi Kasei Chemicals Corp., number-average mol. wt. 25,000, average no. phenolic hydroxyl groups per molecule: 1.84
Polyphenylene ether 3: S203A, Asahi Kasei Chemicals Corp., number-average mol. wt. 10,000, average no. phenolic hydroxyl groups per molecule: 1.84
Triallylisocyanurate: Nihon Kasei Co., Ltd.
Polystyrene: 650, PS Japan
Styrene-based elastomer: SOE L606, Asahi Kasei Chemicals Corp.
Silica: Spherical silica, Tatsumori, Ltd.
Decabromodiphenylethane: SAYTEX8010, Albemarle Japan Corp.
α,α'-bis(t-Butylperoxy-m-isopropyl)benzene: PerbutylP, NOF Corp.

Based on the results in Table 1, the prepregs of the examples all had no powder fall-off or peeling of the resins, and excellent handleability, compared to the prepregs of the comparative examples.

In addition, the copper-clad laminates and laminated sheets obtained from the prepregs of Examples 1 to 15 all had higher copper foil peel strengths and more excellent water absorption resistance, soldering heat resistance and electrical characteristics compared to the comparative examples. Furthermore, as regards the electrical characteristics, there was low variation in the steady state and the moisture absorption state, and the stability was excellent. The cured products had excellent adhesion (interlayer peel strength in the multilayer boards, or peel strength between the cured curable resin compositions and the metal foil, such as copper foil).

The copper-clad laminate and laminated sheet obtained from the prepreg of Comparative Example 1, wherein the prepreg was produced using high-molecular-weight PPE particles but in a dissolved state so that PPE particles did not remain in the prepreg, had somewhat poorer copper foil peel strength, water absorption resistance and soldering heat resistance compared to the copper-clad laminates and laminated sheets obtained from the prepregs of Examples 2, 3 and 8 to 15 which had the same resin composition. The electrical characteristics in the steady state were also equivalent, but the electrical characteristics in the moisture absorption state were reduced.

The copper-clad laminates and laminated sheets obtained from the prepregs of Comparative Examples 2, 3 and 6, wherein low molecular weight PPE was used so that PPE particles did not remain in the prepreg, had somewhat poorer copper foil peel strength, water absorption resistance and soldering heat resistance compared to the copper-clad laminates and laminated sheets obtained from the prepregs of Examples 1 to 15. The electrical characteristics in the steady state were also equivalent, but the electrical characteristics in the moisture absorption state were reduced.

The copper-clad laminate and laminated sheet obtained from the prepreg of Comparative Example 5, wherein the PPE content in the PPE particles (A) was low at 60%, had poorer copper foil peel strength, water absorption resistance, soldering heat resistance and electrical characteristics compared to the copper-clad laminates and laminated sheets obtained from the prepregs of Examples 2, 3 and 8 to 14 which had the same resin composition.

Test Example 2

Table 2 shows the evaluation results obtained using a copper foil with a thickness of 12 μm and a surface roughness Rz of 2.0 μm (FV-WS foil, product of Furukawa Electric Co., Ltd.) as the copper foil.

TABLE 2

| | Prepreg B | Prepreg R | Prepreg S | Prepreg P | Prepreg U | Prepreg O |
|---|---|---|---|---|---|---|
| Glass transition temperature (° C.) | 205 | 196 | 192 | 202 | 210 | 215 |
| Interlayer peel strength (N/mm) | 1.2 | 0.9 | 0.7 | 0.7 | 0.4 | 1.0 |
| Copper foil peel strength (N/mm) | 0.9 | 0.7 | 0.7 | 0.4 | 0.6 | 0.8 |
| Peel strength ratio | 1.3 | 1.3 | 1.0 | 1.8 | 0.7 | 1.3 |
| Dielectric loss tangent [10 GHz] | 0.0049 | 0.0052 | 0.0052 | 0.0053 | 0.0058 | 0.0052 |
| CTE (ppm/K) | 40 | 50 | 45 | 50 | 40 | 75 |
| Heat resistance test | Satisfactory | Satisfactory | Satisfactory | Delamination | Satisfactory | Satisfactory |
| Cross-sectional observation after heat resistance test | Satisfactory | Satisfactory | Satisfactory | — | Cracking near copper foil | Cracking near base material |

The laminated sheet using prepreg P had a low copper foil peel strength of 0.4 N/mm, and failed to satisfy the requirements for a laminated sheet of the second mode, while the results of cross-sectional observation indicated that delamination of the copper foil had occurred in the heat resistance test.

The laminated sheet using prepreg U had a copper foil peel strength of greater than 0.6 N/mm, but the interlayer peel strength was low at 0.4 N/mm, which was only 0.7 times the copper foil peel strength, and it failed to satisfy the requirement of a peel strength ratio of between 0.8 and 1.8 for the laminated sheet of the second mode, while the results of cross-sectional observation also showed cracking of the resin near the copper foil.

The laminated sheet using prepreg 0 had a large CTE of 75 ppm/K and failed to satisfy the requirements for a laminated sheet of the second embodiment, while the results of cross-sectional observation showed cracking of the resin near the copper foil.

INDUSTRIAL APPLICABILITY

Because adhesion between the PPE-containing curable resin composition and the base material is satisfactory, it is possible to provide a prepreg for an electronic circuit board that can yield a cured product having low resin dust fall-off and resin flaking during production and handling, as well as excellent adhesion by hot pressure molding (for example, interlayer peel strength for multilayer boards, or peel strength between cured curable resin compositions and metal foils such as copper foils), moisture absorption resistance, heat resistance and stability of electrical characteristics under hygroscopic conditions, and it can be suitably used for production of an electronic circuit board comprising a cured product of the prepreg.

Furthermore, since the prepreg has excellent adhesion between low-dielectric resins and low-roughness metal foils, there is no peeling or blistering of the copper foil during production and handling and a low-roughness metal foil may be used to obtain satisfactory transmission characteristics, and it can be suitably used in a layered material for an electronic circuit board that has minimal peeling of the base material sections or resin cracking near the base material or metal foil during production and handling.

In addition, even when a low-dielectric resin with a dielectric loss tangent of no greater than 0.007 is used, the laminated sheet is a highly reliable laminated sheet that is resistant to cracking under thermal load, moisture absorption load and mechanical load, and it can be suitably used as an electronic circuit board.

What is claimed is:

1. A laminated sheet made of a prepreg comprising a low-dielectric resin and a base material, wherein:
   (1) the dielectric loss tangent of the laminated sheet at 10 GHz is no greater than 0.007 (cavity resonance method),
   (2) the metal foil peel strength of a metal foil laminated sheet formed by laminating the prepreg with a metal foil that has a side with a surface smoothness of no greater than Rz 2.0 μm is 0.6 N/mm or greater,
   (3) the coefficient of linear thermal expansion of the laminated sheet (≤Tg) is between 20 ppm/K and 60 ppm/K,
   (4) the peel strength between the low-dielectric resin and the base material is between 0.8 and 1.8 times the metal foil peel strength,
   (5) the low-dielectric resin comprises polyphenylene ether (PPE) at between 10 mass % and 70 mass % based on 100 mass % as the low-dielectric resin, and
   (6) the PPE has a number-average molecular weight of between 1,000 and 7,000, and the average number of phenolic hydroxyl groups per PPE molecule is between 0.1 and 0.8.

2. A laminated sheet according to claim 1, wherein the Tg of the laminated sheet is 180° C. or higher.

3. A laminated sheet according to claim 1, wherein the thickness of the metal foil is less than 35 μm.

4. A laminated sheet according to claim 1, wherein the metal foil peel strength is 0.8 N/mm or greater.

5. A laminated sheet according to claim 1, wherein the peel strength between the low-dielectric resin and the base material is 0.6 N/mm or greater.

6. A laminated sheet according to claim 1, wherein the ratio of the peel strength between the low-dielectric resin and the base material, and the metal foil peel strength is between 1.05 and 1.8.

7. A laminated sheet according to claim 6, wherein the ratio of the peel strength between the low-dielectric resin and the base material, and the metal foil peel strength is between 1.3 and 1.8.

* * * * *